(12) United States Patent
Fukada et al.

(10) Patent No.: US 6,423,563 B2
(45) Date of Patent: Jul. 23, 2002

(54) METHOD FOR MANUFACTURING SEMICONDUCTOR DYNAMIC QUANTITY SENSOR

(75) Inventors: Tsuyoshi Fukada, Aichi-gun; Minekazu Sakai; Minoru Murata, both of Kariya; Yukihiro Takeuchi, Nishikamo-gun; Seiki Aoyama, Toyohashi, all of (JP)

(73) Assignee: Denso Corporation, Kariya (JP)

( * ) Notice: Subject to any disclaimer, the term of this patent is extended or adjusted under 35 U.S.C. 154(b) by 18 days.

(21) Appl. No.: 09/861,535

(22) Filed: May 22, 2001

Related U.S. Application Data

(62) Division of application No. 09/306,381, filed on May 6, 1999.

(30) Foreign Application Priority Data

| May 8, 1998 | (JP) | 10-126288 |
| Dec. 25, 1998 | (JP) | 10-369840 |
| Feb. 19, 1999 | (JP) | 11-41967 |

(51) Int. Cl.[7] ................ H01L 29/84; G01P 15/125
(52) U.S. Cl. ........................... 438/50; 257/419
(58) Field of Search ............. 438/50, 48, 52–53, 438/739, 316, 584; 430/5; 257/419, 798; 216/2, 92; 73/504.02, 105; 250/306

(56) References Cited

U.S. PATENT DOCUMENTS

| 5,202,281 A | 4/1993 | Ishibashi |
| 5,332,469 A | 7/1994 | Mastrangelo |
| 5,542,558 A | 8/1996 | Benz et al. |
| 5,563,343 A | 10/1996 | Shaw et al. |
| 5,573,679 A | 11/1996 | Mitchell et al. |
| 5,576,250 A | 11/1996 | Diem et al. |
| 5,595,942 A | 1/1997 | Albrecht et al. |
| 5,610,335 A | 3/1997 | Shaw et al. |
| 5,616,523 A | 4/1997 | Benz et al. |
| 5,628,917 A | 5/1997 | MacDonald et al. |
| 5,683,546 A | 11/1997 | Manaka |
| 5,683,591 A | 11/1997 | Offenberg |
| 5,684,324 A | 11/1997 | Bernstein |
| 5,723,353 A | 3/1998 | Muenzel et al. |
| 5,801,070 A | 9/1998 | Fisher et al. |
| 5,804,457 A | 9/1998 | Benz et al. |
| 5,883,009 A | 3/1999 | Villa et al. |
| 5,888,845 A | 3/1999 | Bashir et al. |
| 5,949,119 A | 9/1999 | Vilian |
| 5,970,315 A | 10/1999 | Carley et al. |
| 5,998,816 A | 12/1999 | Nakaki et al. |
| 6,069,392 A | 5/2000 | Tai et al. |
| 6,071,426 A | 6/2000 | Lee et al. |
| 6,074,890 A | 7/2000 | Yao et al. |
| 6,117,701 A | 9/2000 | Buchan et al. |
| 6,167,761 B1 | 1/2001 | Hanzawa |

FOREIGN PATENT DOCUMENTS

| JP | 09 431 94 | 1/1995 | |
| JP | 409018022 A | * 1/1997 | ........... H01L/29/84 |
| JP | 11031825 | 2/1999 | |
| JP | 11220140 | 8/1999 | |
| JP | 11230982 | 8/1999 | |
| JP | 2000065583 | 3/2000 | |

* cited by examiner

*Primary Examiner*—Keith Christianson
*Assistant Examiner*—Craig Thompson
(74) *Attorney, Agent, or Firm*—Pillsbury Winthrop LLP

(57) ABSTRACT

A semiconductor dynamic quantity sensor includes a semiconductor support substrate having a specific resistance equal to or less than 3Ω cm. An insulation film is provided on the support substrate and a semiconductor layer is provided on the support substrate with the insulation film interposed therebetween. The semiconductor layer has a specific resistance equal to or less than 3Ω cm. A movable electrode is provided in the semiconductor layer to be displaced according to a dynamic quantity acting thereto. A fixed electrode is fixedly provided in the semiconductor layer to make a specific gap with the movable electrode and to from a capacitor with the movable electrode. The capacitor has a capacity that changes in response to displacement of the movable electrode to detect the dynamic quantity.

36 Claims, 22 Drawing Sheets

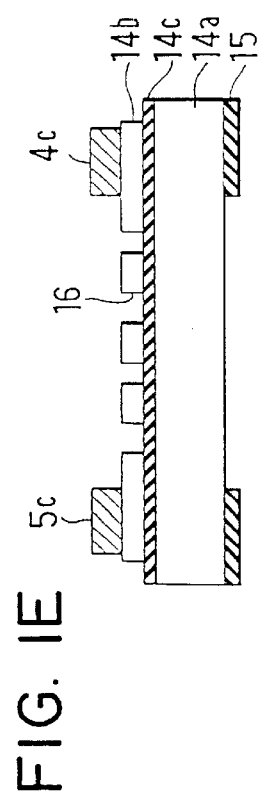
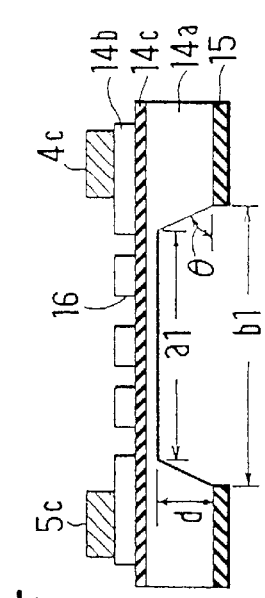
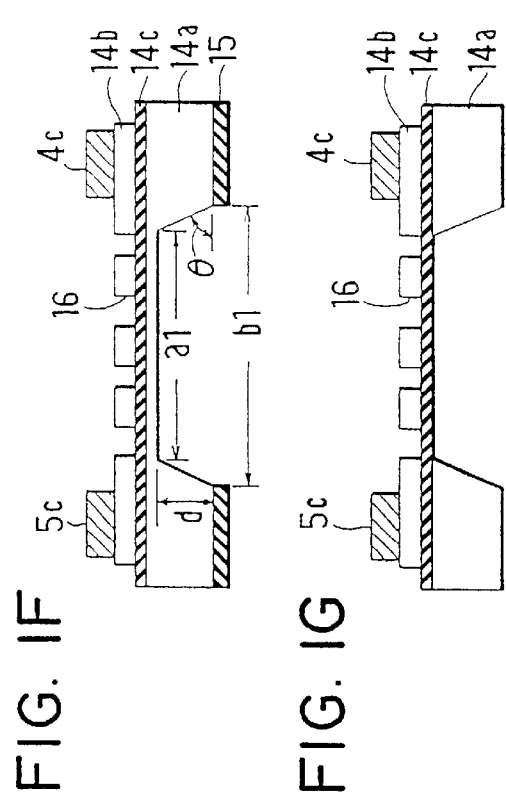
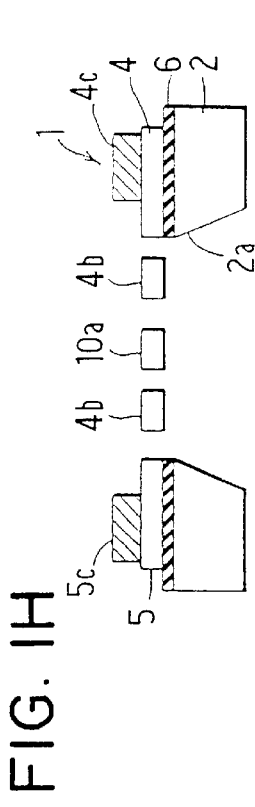
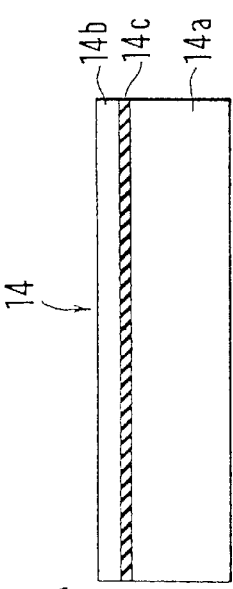
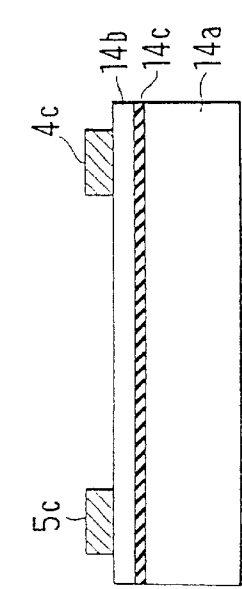
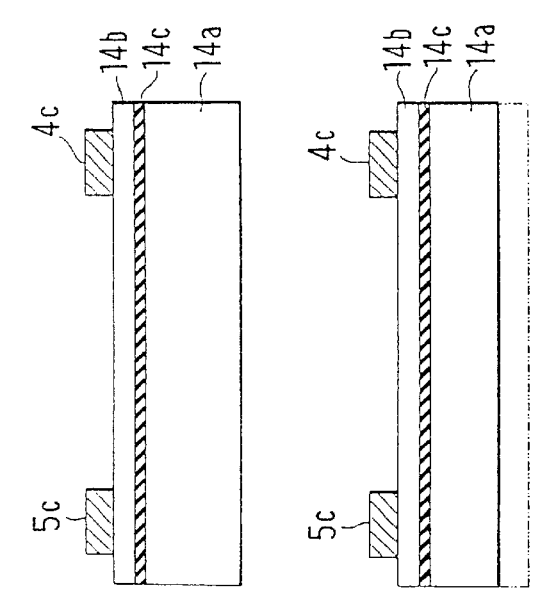
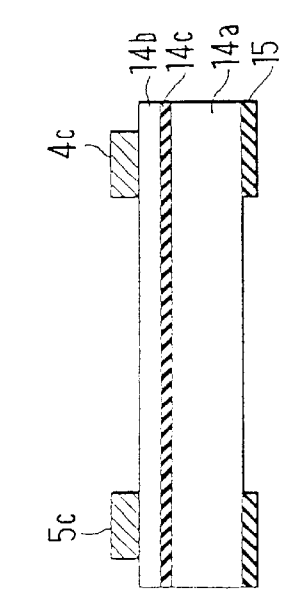

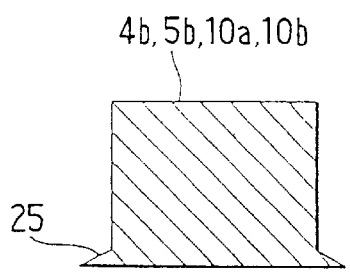
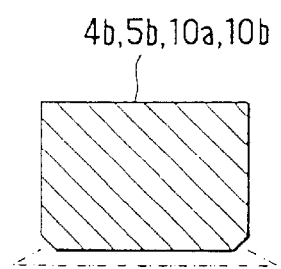
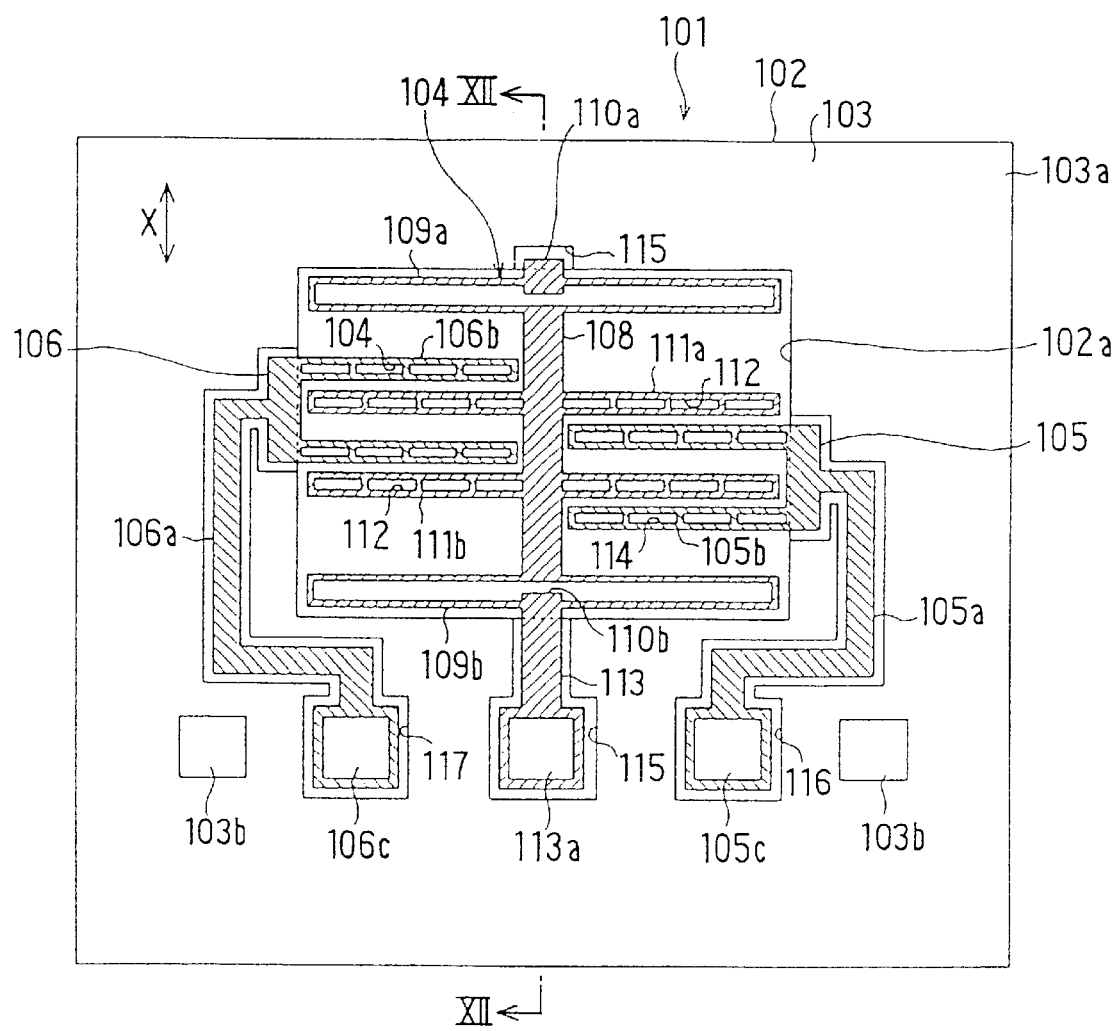

METHOD FOR MANUFACTURING SEMICONDUCTOR DYNAMIC QUANTITY SENSOR

CROSS REFERENCE TO THE RELATED APPLICATIONS

This application is a division of Ser. No. 09/306,381 filed May 6, 1999.

This application is based upon and claims the benefit of priority of the prior Japanese Patent Applications No. 10-126288 filed on May 8, 1998, No. 10-369840 filed on Dec. 25, 1998, and No. 11-41967 filed on Feb. 19, 1999, the contents of which are incorporated herein by reference.

BACKGROUND OF THE INVENTION

1. Field of the Invention

The present invention relates to a capacity type semiconductor dynamic quantity sensor which provides the displacement of a movable portion in response to a dynamic quantity acting thereon as a sensor output and a method for manufacturing the same.

2. Description of the Related Art

For example, a capacity type semiconductor acceleration sensor has a configuration in which a beam structure is provided as a movable portion displaced in response to acceleration acting thereon. The displacement of the beam structure is output as a change in the capacity of a capacitor formed between a movable electrode provided integrally with the beam structure and a fixed electrode provided on a substrate. As disclosed in Japanese Patent Application Laid-Open No. 6-349806 and etc., such a semiconductor acceleration sensor has been manufactured using a method including the steps of providing a semiconductor substrate having an SOI structure by forming a second semiconductor layer on a first semiconductor layer (support substrate) with an insulation layer interposed therebetween, patterning the first semiconductor layer into a predetermined configuration in accordance with the configurations of the beam structure, fixed electrode and the like, and etching the insulation layer as a sacrificial layer. The beam structure having the movable electrode and the fixed electrode is eventually formed on a semiconductor substrate.

The above-described manufacturing method must inevitably include the step of etching the sacrificial layer using an etchant. At the step of etching the sacrificial layer, the surface tension of the etchant frequently causes the so-called sticking phenomenon that is sticking of the beam structure (especially the movable electrode) to other regions (particularly, the fixed electrode). Such a phenomenon leads to a failure in that the detection of any change in the capacity between the movable and fixed electrodes is disabled. This has resulted in a problem with the manufacturing method in the prior art in that it inevitably results in a reduction of yield.

It has been also revealed in that a conventional capacity type semiconductor dynamic quantity sensor has a problem as described below when the second semiconductor layer having the movable and fixed electrodes formed therein and the first semiconductor layer supporting the same (support substrate) have relatively high specific resistances.

Specifically, in general, a capacity type semiconductor dynamic quantity sensor utilizes a carrier wave signal having a relatively high frequency to output a change in the capacity thereof. In this case, when a voltage in accordance with the carrier wave signal is applied between the movable and fixed electrodes forming a capacitor, charge is generated at a side of the movable electrode which corresponds to the product of the capacity of the capacitor and a potential difference between the fixed electrode and itself. Any change in the capacity of the capacitor is output using the movement of the charge.

The charge movement thus caused involves a path for applying the voltage to the movable and fixed electrodes and a time constant that depends on the resistance and capacity of a path for outputting the charge. However, since such paths include resistive elements (including the movable and fixed electrodes themselves) formed by the second semiconductor layer and parasitic resistive elements formed on the first semiconductor layer through the insulation layer, the time constant is larger when the first and second semiconductor layers have relatively high specific values of resistance. Such a large time constant suppresses the rate of the charge movement and delays the rise of the carrier wave signal. Therefore, the detection of dynamic quantities utilizing the capacity of the capacitor provides results deviated from values which should normally be obtained, resulting in deterioration of dynamic quantity detection characteristics.

SUMMARY OF THE INVENTION

The present invention has been conceived taking the above-described situation into consideration. It is a first object of the invention to provide a method for manufacturing a semiconductor dynamic quantity sensor which is advantageous in that a movable electrode thereof can be reliably prevented from sticking to other regions during manufacture of the same to allow improved yield. It is a second object of the invention to provide a capacity type semiconductor dynamic quantity sensor in which dynamic quantity detection characteristics can be improved with a simple configuration.

To achieve the first object, according to a method for manufacturing a semiconductor dynamic quantity sensor of the present invention, when a movable portion is formed in a first semiconductor region that is provided on a second semiconductor region with an insulation film interposed therebetween, both the first semiconductor region and the second semiconductor region are etched to form a movable portion in the first semiconductor region. At that time, the movable portion is finally defined at a movable portion defining step that is carried out in a vapor phase atmosphere. In this method, the movable portion does not stick to other regions due to an etchant during the manufacture thereof, resulting in improved yield.

Preferably, the step of forming the movable portion includes steps of forming a trench in the first semiconductor region, etching the second semiconductor region to expose at least a portion of the insulation film corresponding to the trench, and performing the movable portion defining step. More preferably, after forming the trench, a protection film is formed on the first semiconductor region and in the trench. In this case, one of the first semiconductor region, the second semiconductor region, the insulation film, and the protection film is etched at the movable portion defining step to finally define the movable portion. The second semiconductor region may be etched first by a first etching step using an etchant to be a specific thickness and be etched by a second etching step in a vapor phase atmosphere. In this case, the second etching step and the movable portion defining step can be successively performed without changing an etching condition. Otherwise, the semiconductor layer may be etched only in the vapor phase atmosphere, resulting in a simplified process.

Before performing the movable portion defining step, a dicing step may be carried out to cut the semiconductor substrate into a sensor chip so that it can be carried out without damaging the movable portion.

After performing the movable portion defining step, a hydrophobic thin film may be formed on the movable portion. The hydrophobic thin film prevents the movable portion from sticking to other regions due to an electrostatic force not only at the manufacture thereof but at a sensor operational state, and the like. This is because the surface energy of the movable portion is decreased by the hydrophobic thin film so that even when it sticks to an object, it is easily detached from the object. The step of forming the hydrophobic thin film can be carried out simultaneously with the movable portion defining step in the vapor phase atmosphere.

To achieve the second object, a semiconductor dynamic quantity sensor of the present invention includes a semiconductor support substrate having a specific resistance equal to or less than 3 Ω·cm and a semiconductor layer provided on the support substrate with an insulation film interposed therebetween and having a specific resistance equal to or less than 3 Ω·cm. A movable electrode and a fixed electrode are provided in the semiconductor layer to form a capacitor therebetween. The capacitor provides a capacity that changes in response to displacement of the movable electrode to detect the dynamic quantity.

In this dynamic quantity sensor, since the values of the specific resistance of the support substrate and the semiconductor layer are equal to or less than 3 Ω·cm, not only the movable electrode and the fixed electrode but also parasitic resistors provided on the support substrate side have low values of resistance as well. As a result, variation of value detected based on the capacity of the capacitor between the movable and fixed electrodes is decreased, resulting in improvement of detection characteristics.

Preferably, the fixed electrode includes a first fixed electrode portion forming a first capacitor with the movable electrode and a second fixed electrode portion forming a second capacitor with the movable electrode. The first capacitor and the second capacitor provide first and second capacities that change on a differential basis according to the displacement of the movable electrode. Accordingly, a change of the electrostatic capacities are apparently increased relative to the dynamic quantity to be detected to improved an S/N ratio.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIGS. 1A to 1H are cross-sectional views showing manufacturing steps of a semiconductor acceleration sensor in a first preferred embodiment;

FIGS. 10A and 10B are cross-sectional view showing a specific portion of a semiconductor acceleration sensor at manufacturing steps thereof in an eighth preferred embodiment;

FIG. 11 is a plan view showing a semiconductor acceleration sensor in a ninth preferred embodiment of the present invention;

DETAILED DESCRIPTION OF PREFERRED EMBODIMENTS

A description will be made with reference to FIGS. 1A through 1H, FIG. 2 and FIG. 3 on a first preferred embodiment which is an application of the present invention to a method for manufacturing a semiconductor acceleration sensor.

Figure 2:
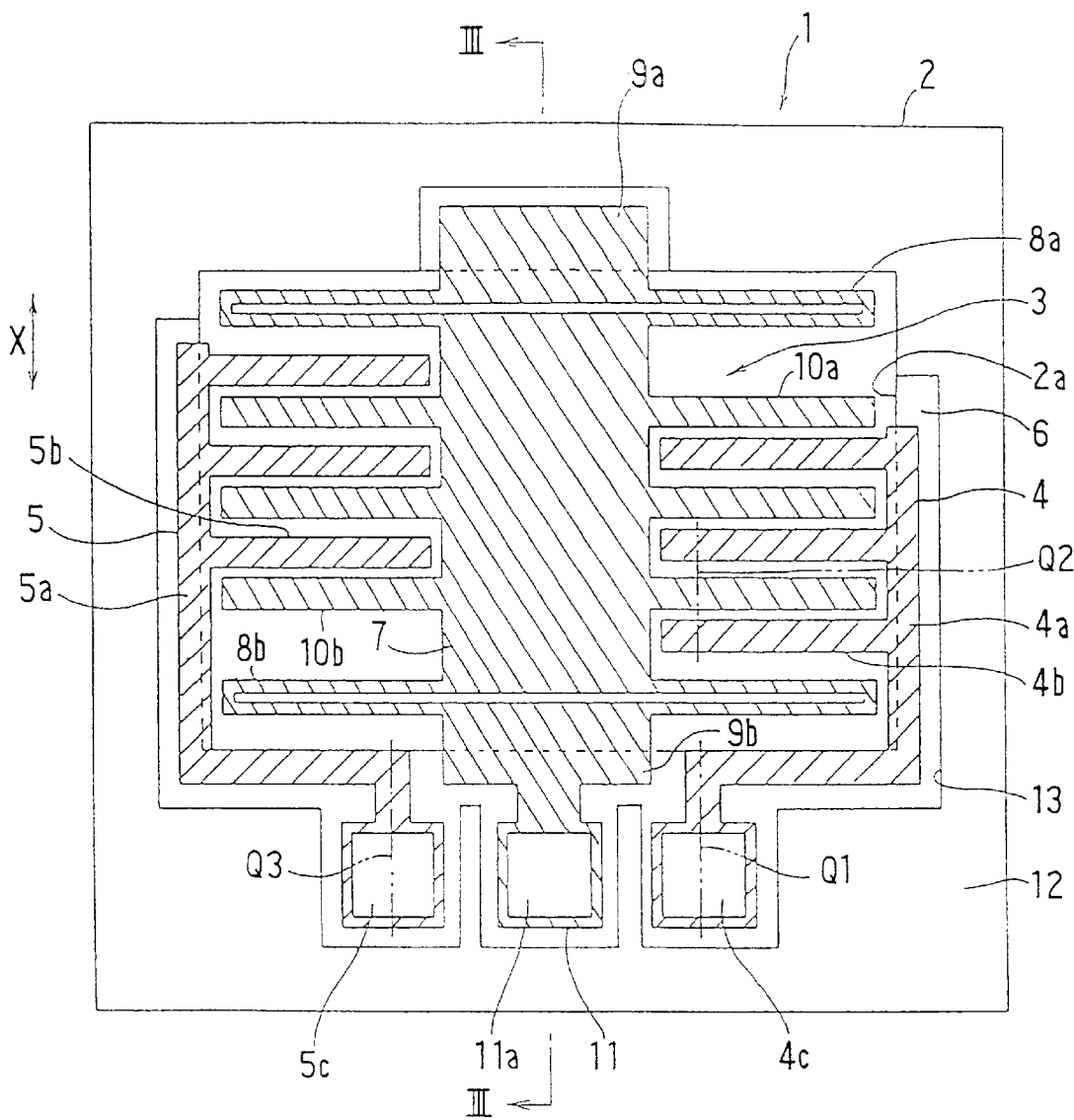
FIG. 2 is a plan view showing the semiconductor acceleration sensor in the first embodiment.
Figure 3:
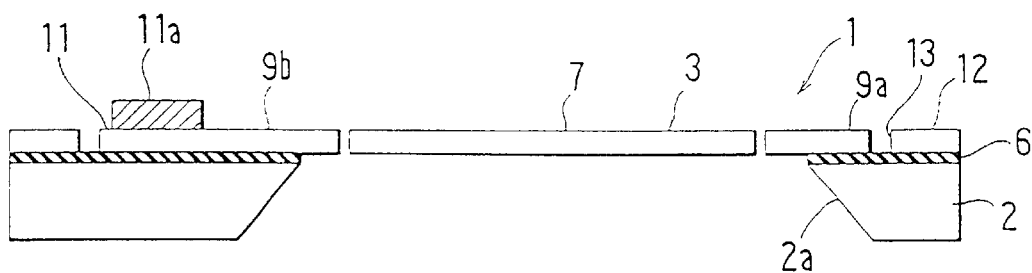
FIG. 3 is a cross-sectional view taken along a III—III line in FIG. 2.

FIGS. 2 and 3 show a semiconductor acceleration sensor 1 as a semiconductor dynamic quantity sensor. In FIGS. 2 and 3, a support substrate 2 made of, for example, single crystal silicon is formed in a rectangular frame-like configuration having an opening 2a. A beam structure 3 (movable portion) for detecting a dynamic quantity made of single crystal silicon and a pair of fixed electrode structures 4 and 5 are provided on the upper surface of the substrate 2 with an insulation film 6 constituted by a silicon oxide film interposed therebetween.

The beam structure 3 has a configuration in which both ends of a rectangular mass portion 7 are integrally connected to anchor portions 9a and 9b through rectangular frame-like beam portions 8a and 8b. The anchor portions 9a and 9b are supported on opposite sides of the support substrate 2 with the insulation film 6 interposed. Thus, the mass portion 7 and beam portions 8a and 8b face the opening 2a of the support substrate 2. The beam portions 8a and 8b have the function of a spring in that they cause the mass portion 7 to be displaced in a direction indicated by an arrow X in FIG. 2 when subjected to acceleration having a component in the same direction and cause it to return to the initial state as the acceleration stops. The beam structure 3 has, for example, three each movable electrodes 10a and 10b which are integral with the mass portion 7 and protrude from both sides thereof in a direction orthogonal thereto, such that the movable electrodes 10a and 10b also face the opening 2a of the support substrate 2. Each of the movable electrodes 10a and 10b has a bar-like configuration having a rectangular section.

A movable electrode wiring portion 11 integrally connected to the anchoring portion 9b of the beam structure 3 is formed on the support substrate 2 with the insulation film 6 interposed therebetween. An electrode pad 11a for wire bonding is formed from, for example, aluminum in a predetermined position on the wiring portion 11.

The fixed electrode structure 4 includes, as integral parts thereof, a fixed electrode wiring portion 4a formed on the support substrate 2 with the insulation film 6 interposed therebetween and, for example, three fixed electrodes 4b provided in parallel with one side of the movable electrodes 10a at a predetermined detection gap. Each of the fixed electrodes 4b is supported on the fixed electrode wiring portion 4a at one end thereof. Thus, the fixed electrodes 4b face the opening 2a of the support substrate 2.

The fixed electrode structure 5 includes, as integral parts thereof, a fixed electrode wiring portion 5a formed on the support substrate 2 with the insulation film 6 interposed therebetween and, for example, three fixed electrodes 5b provided in parallel with one side of the movable electrodes 10b (the side on the same plane as side opposite to the detection gap side of the movable electrodes 10a) at a predetermined detection gap. Each of the fixed electrodes 5b is supported on the fixed electrode wiring portion 5a at one end thereof. Thus, the fixed electrodes 5b face the opening 2a of the support substrate 2.

Each of the fixed electrodes 4b and 5b has a bar-like configuration having a rectangular section. Electrode pads 4c and 5c for wire bonding are formed from aluminum in predetermined positions on the fixed electrode wiring portions 4a and 5a, respectively. A shielding thin film 12 made of single crystal silicon is provided at the periphery of the support substrate 2 and is isolated by an insulation trench 13 to serve as a base material for the beam structure 3 and fixed electrode structures 4 and 5.

In the semiconductor acceleration sensor 1 having the above-described configuration, a first capacitor is formed between the movable electrodes 10a and fixed electrodes 4b, and a second capacitor is formed between the movable electrodes 10b and fixed electrodes 5b. The capacity of the first and second capacitors changes on a differential basis in accordance with displacement of the movable electrodes 10a and 10b caused by acceleration including a component in the direction of the arrow X in FIG. 2 that acts on the mass portion 7. Such a change in the capacity can be output through the electrode pads 4c, 5c and 11a to detect the acceleration.

FIGS. 1A through 1H are schematic sectional views showing an example of manufacturing steps for the above-described semiconductor acceleration sensor 1 which will be described below. FIG. 1H schematically shows a model of a partial sectional structure of the semiconductor acceleration sensor 1 (a model representing sectional structures of the regions indicated by the two-dot chain lines Q1, Q2 and Q3 in FIG. 2 in combination). FIGS. 1A through 1G are schematic sectional views of the regions corresponding to such a model of the sectional structure during the manufacture of the same.

First, an SOI substrate 14 as shown in FIG. 1A is provided. The SOI substrate 14 has a structure composed of a single crystal silicon wafer 14a which eventually becomes the support substrate 2 and a single crystal silicon thin film 14b provided on the single crystal silicon wafer 14a with a silicon oxide film 14c interposed therebetween. The single crystal silicon wafer 14a has a plane orientation set at (100) on the surface thereof and has a thickness of at least about 300 $\mu$m. The single crystal silicon thin film 14b also has a plane orientation of (100) on the surface thereof and is set at a thickness of, for example, about 1 $\mu$m. For example, phosphorus is diffused at a high concentration (about $1 \times 10^{19}/cm^3$ or more) in the single crystal silicon thin film 14b to reduce the specific resistance thereof and to provide ohmic contact to the electrode pads 4c, 5c and 11a.

Next, a step of forming the electrode pads as shown in FIG. 1B is carried out. At this step, aluminum is deposited on the entire surface of the single crystal thin film 14b to a thickness of, for example, about 1 $\mu$m, and thereafter, the aluminum film is patterned using photolithographic and etching techniques to form the electrode pads 4c, 5c and 11a (11a is not shown in FIG. 1B). At this step of forming the electrode pads, a well-known thermal treatment (sintering) is carried out as needed to provide ohmic contact to the electrode pads 4c, 5c and 11a.

In this state, a dimension adjusting step as shown in FIG. 1C is carried out to ground and polish the surface of the single crystal silicon wafer 14a opposite to the side of the silicon thin film 14b. Thus, the thickness of the wafer 14a is adjusted to, for example, 300 $\mu$m, and mirror finishing is performed on the processed surface. As will be detailed later, the adjustment of the thickness of the single crystal silicon wafer 14a is carried out to reduce the depth of etching when the opening 2a is formed using anisotropic etching, thereby preventing the expansion of the design dimensions of the chip attributable to the anisotropic etching.

Then, a step of forming a mask as shown in FIG. 1D is carried out to deposit a silicon nitride film on the entire surface of the single crystal silicon wafer 14a (mirror finished surface) to a thickness of about 0.5 $\mu$m using, for example, a plasma etching process. The silicon nitride film is then patterned using photolithographic and etching techniques to form a mask 15 to be used during the etching to form the opening 2a.

Thereafter, a trench forming step as shown in FIG. 1E is carried out to form trenches 16 which extend in the single crystal thin film 14b to reach the silicon oxide film 14c. Specifically, anisotropic etching is carried out using a dry etching apparatus with resist (not shown), which is resistant to dry etching and is formed on the single crystal silicon thin film 14b and electrode pads 4c, 5c and 11a in predetermined patterns (in configurations corresponding to the beam structure 3, fixed electrode structures 4 and 5 and shielding thin film 12).

Next, a first etching step shown in FIG. 1F is carried out to selectively etch the single crystal silicon wafer 14a from the surface opposite to the silicon oxide film 14c using the mask 15 and using, for example, an aqueous solution of KOH. In this case, when such etching proceeds up to the silicon oxide film 14c, there is a very high possibility of the breakage of the single crystal silicon thin film 14b as a result of the breakage of the silicon oxide film 14c due to the pressure of the etchant. Therefore, in order to prevent the breakage of the silicon thin film 14b, it is necessary to control the etching time accurately to prevent the etching from proceeding up to the silicon oxide film 14c. For example, such control over the etching time is carried out through calculations based on the thickness of the single crystal silicon wafer 14a and the etching rate of the etchant. In the present embodiment, the etching time is controlled such that the single crystal silicon wafer 14a is left with a thickness of about 10 μm. Although not specifically shown, the top surface of the SOI substrate 14 is covered with resist before the first etching step is carried out, and the resist is removed after, for example, the first etching step.

Next, at a second etching step shown in FIG. 1G, dry etching is carried out using, for example, a plasma etching apparatus on the surface of the single crystal silicon wafer 14a to remove the single crystal silicon wafer 14a having a thickness of about 10 μm which has been left on the silicon oxide film 14c at the first etching step. As a result, the rear surface (lower surface) of the silicon oxide film 14c is exposed. Such dry etching also removes the mask 15 simultaneously.

At a third etching step shown in FIG. 1H, dry etching is carried out from the rear surface of the silicon oxide film 14c (the surface toward the single crystal silicon wafer 14a) using the dry etching apparatus used at the second etching step with its etching rate changed. Thus, the silicon oxide film 14c is removed. As a result of the execution of such a third etching step, the opening 2a is formed, and the mass portion 7, beam portions 8a and 8b and movable electrodes 10a and 10b of the beam structure 3 are released. Simultaneously, the fixed electrodes 4b and 5b of the fixed electrode structures 4 and 5 are also released to be cantilevered from the fixed electrode wiring portions 4a and 5a, respectively. Thus, the beam structure 3 and the fixed electrode structures 4 and 5 are formed (defined) as the third etching step is carried out.

After the execution of such a third etching step, a dicing step is carried out to cut the SOI substrate 14 into sensor chips in a predetermined configuration. As a result, a basic structure of the semiconductor acceleration sensor 1 is completed.

In the above-described manufacturing method, dry etching is carried out as the third etching step, i.e., as the final step for releasing the beam structure 3 having the mass portion 7, beam portions 8a and 8b and movable electrodes 10a and 10b. This eliminates the sticking phenomenon, i.e., the adherence of the beam structure 3 to fixed regions such as the fixed electrode structures 4 and 5 attributable to the surface tension of an etchant as encountered in conventional configurations wherein wet etching is carried out at the final step. Consequently, the yield of production can be improved.

The first etching step utilizing an aqueous solution of KOH as the etchant leaves the single crystal silicon wafer 14a with a predetermined thickness on the silicon oxide film 14c and, thereafter, the residual single crystal silicon wafer 14a is removed by dry etching at the second etching step. Therefore, the pressure of the etchant at the first etching step is received by both of the silicon oxide film 14c and single crystal silicon wafer 14a, which reduces the possibility of the breakage of the silicon oxide film 14c and consequently the single crystal silicon thin film 14b. In addition, since the second etching step to expose the silicon oxide film 14c is also dry etching, the possibility of the breakage of the silicon oxide film 14c and consequently the single crystal silicon thin film 14b is low during the execution of the same step. It is therefore possible to prevent reduction of the yield of production.

Further, since the movable portions of the beam structure (mass portion 7, beam portions 8a and 8b and movable electrodes 10a and 10b) and the fixed electrodes 4b and 5b of the fixed electrode structures 4 and 5 face the opening 2a when completed, there is another advantage in that they can be easily visually checked on both of the front and rear surfaces thereof.

The reason for the grinding and polishing step as shown in FIG. 1C will be described in more detail with reference to FIG. 1F. Assuming that a1 represents a design dimension of the opening 2a, in order to achieve the dimension a1 accurately, it is preferable that the first etching step involves anisotropic etching that can suppress the progress of etching in the lateral direction. Therefore, the present embodiment employs an aqueous solution of KOH to perform such anisotropic etching on the single crystal silicon wafer 14a. When the single crystal silicon wafer 14a having a plane orientation of (100) is used as in the present embodiment, such anisotropic etching proceeds in a direction at an angle θ (=54.7°) from the etching surface as shown in FIG. 1F. Therefore, the relationship between the design dimension a1 of the opening, a mask dimension b1 of the mask and an etching depth d shown in FIG. 1F can be obtained from:

$$b1=a1+2\times(d/\tan 54.7°)$$

Therefore, when the etching depth d is 500 μm, for example, the mask dimension b1 must be greater then the design dimension a1 of the opening by about 700 μm, which increases the size of the chip forming the semiconductor acceleration sensor 1.

In order to reduce the etching depth d to thereby reduce the difference between the design dimension a1 and the mask dimension b1, the dimension adjusting step as described above is carried out in this embodiment. However, when the thickness of the single crystal silicon wafer 14a is extremely decreased, the magnitude of variation of the thickness can increase, and the wafer becomes liable to break during being handled to result in a reduction of yield. It is therefore important to set an optimum thickness (300 μm in this embodiment) taking the capability of the grinding and polishing step into consideration.

In the first embodiment, if the thickness of the single crystal silicon wafer 14a is initially set at about 300 μm, only mirror finishing on the surface thereof is required and there is no need for the dimension adjusting step to reduce the thickness. This obviously simplifies the manufacturing steps as a whole. In such a case, however, the single crystal silicon wafer 14a must be carefully handled.

Further, when the first embodiment employs an SOI substrate 14 obtained by forming a silicon oxide film on the single crystal silicon wafer 14a in advance, the silicon oxide film can be used as an etching mask. This eliminates the need for the process of depositing a silicon nitride film at the mask forming step (see FIG. 1D), thereby simplifying the manufacturing steps further.

Second Embodiment

FIGS. 4A through 4H show a second preferred embodiment of the invention which will be described below only in points different from the first embodiment.

The first embodiment has a configuration wherein the amount etched at the first etching step (see FIG. 1F) for the opening 2a is controlled on the basis of time control. In such a configuration, it is difficult to control the thickness of the residue of the single crystal silicon wafer 14a to achieve the target of about 10 μm because of variation of the thickness of the single crystal silicon wafer 14a, variation of the etching rate of the etchant and the like. As a result, the etching can sometimes proceed up to the silicon oxide film 14c or to a point immediately before the same. In such a state, the pressure of the etchant can cause the breakage of the silicon oxide film 14c and consequently the breakage of the single crystal silicon thin film 14b. A possible method to avoid such a situation is to divide the first etching step into a plurality of steps during each of which the progress of etching is checked to correct the etching time. Such a method however will result in a new problem in that the number of steps is increased.

The second embodiment has been conceived taking the above-described situation into consideration and makes it possible to process the thickness of the residual single crystal silicon wafer 14a at the time of the etching to form the opening 2a into a target value simply and reliably.

Figure 4A:
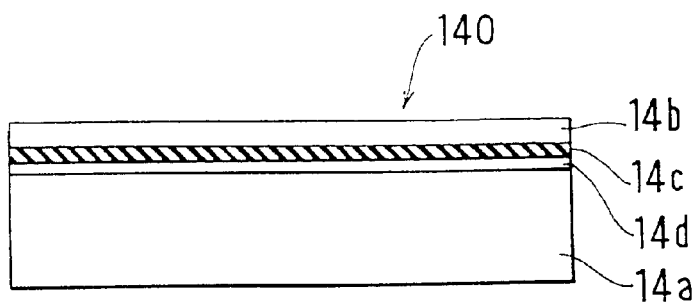
FIGS. 4A to 4H are cross-sectional views showing manufacturing steps of a semiconductor acceleration sensor in a second preferred embodiment.

Specifically, an SOI substrate 140 as shown in FIG. 4A is first provided. The SOI substrate 140 basically has the same configuration as that of the SOI substrate 14 of the first embodiment but has a structure in which a high concentration impurity layer 14d is formed in advance at the interface between the silicon oxide film 14c and the single crystal silicon wafer 14a with a depth of about 10 μm. The high concentration impurity layer 14d is formed by injecting impurity such as boron using ion implantation and then performing a thermal treatment in inert gas atmosphere at a high temperature before forming the SOI substrate 140 through a bonding step and the like. For example, the impurity concentration is set at about $1 \times 10^{19}/cm^3$.

Figure 4B:
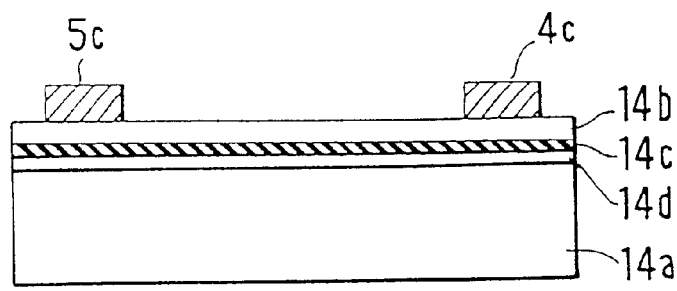
Figure 4C:
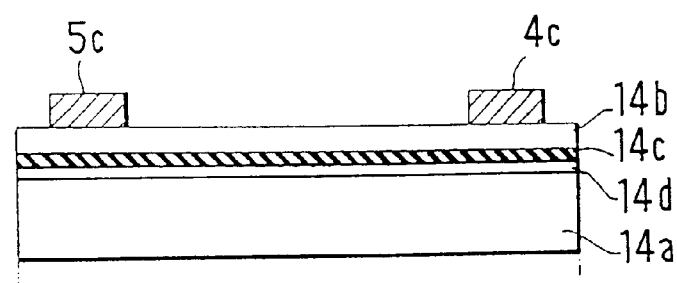
Figure 4D:
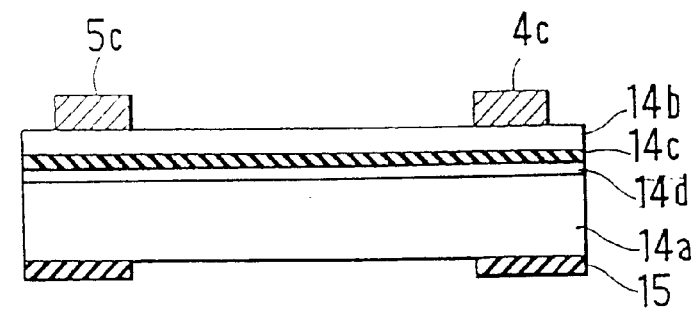
Figure 4E:
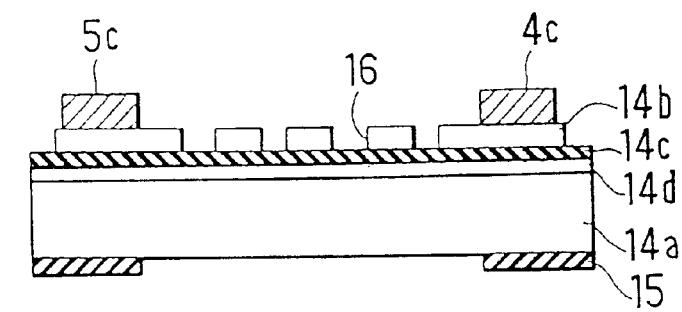
Figure 4F:
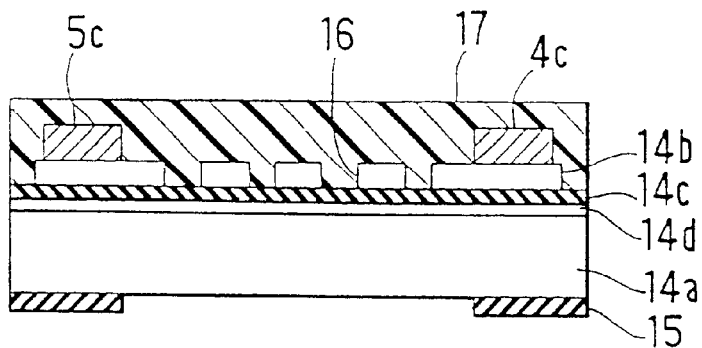

Then, an electrode pad forming step shown in FIG. 4B, a dimension adjusting step shown in FIG. 4C, a mask forming step shown in FIG. 4D and a trench forming step shown in 4E are carried out similarly to those in the first embodiment. Thereafter, as shown in FIG. 4F, a coating step is performed to cover a single crystal silicon thin film 14b with a resist 17.

Figure 4G:
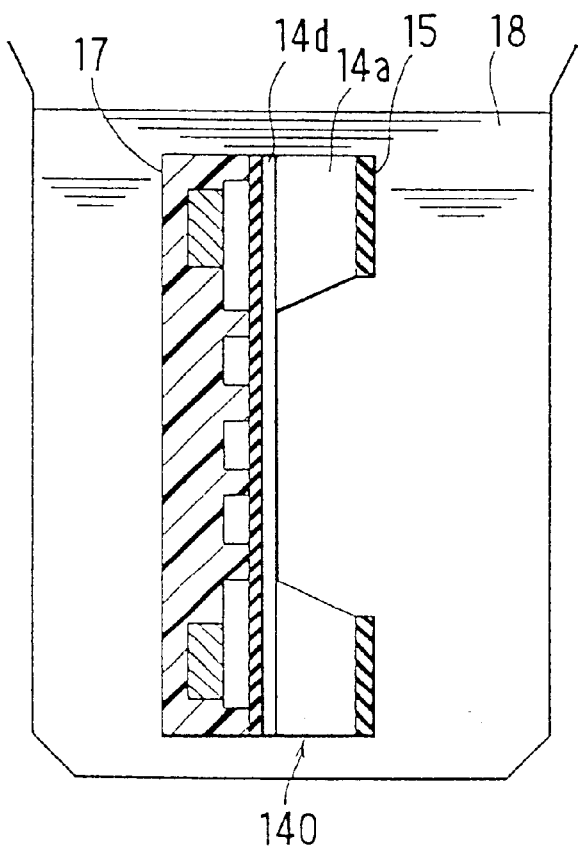

Then, a first etching step shown in FIG. 4G is carried out. At this first etching step, the SOI substrate 140 having the mask 15 and resist 17 thereon is immersed in an etchant 18 constituted by an aqueous solution of KOH for a predetermined period of time to perform anisotropic etching on the single crystal silicon wafer 14a. In this case, silicon having an impurity diffused therein at a high concentration is generally characterized in that it is etched at a very low rate by the etchant 18 (aqueous solution of KOH). Therefore, the etching at the first etching step substantially stops when it has proceeded up to the high concentration impurity layer 14d. It is therefore possible to control the thickness of the residual single crystal silicon wafer 14a accurately in accordance with the depth of the high concentration impurity layer 14d without strict control over the etching time.

Figure 4H:
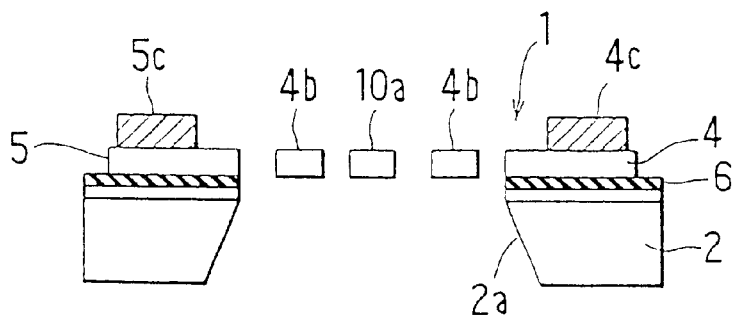

Subsequently, a second etching step is performed using a dry etching apparatus to remove the high concentration impurity layer 14d with the resist 17 removed and, then, a third etching step is performed using the same dry etching apparatus to remove the silicon oxide film 14c to eventually form an opening 2a as shown in FIG. 4H. Then, a dicing step is carried out to cut the SOI substrate 140 into sensor chips in a predetermined configuration of, thereby completing a basic structure of a semiconductor acceleration sensor 1.

According to the second embodiment having such a configuration, the thickness of the residual single crystal silicon wafer 14a can be accurately controlled at the first etching step even when the thickness of the single crystal silicon wafer 14a and the etching rate of the etchant are variable. It is therefore possible to prevent the breakage of the single crystal silicon thin film 14b reliably during the execution of the first etching step. Further, since there is no need for dividing the first etching step into a plurality of steps as described above, the number of steps will not be increased. Since the third step, i.e., the final step, is obviously dry etching, the sticking of movable portions does not occur and the yield of production can be improved.

Third Embodiment

FIGS. 5A through 5H show a third preferred embodiment of the invention which is advantageous like the second embodiment in that the thickness of a residual single crystal silicon wafer 14a at the time of etching for forming an opening 2a can be easily and reliably processed to a target value and which will be described below in points different from the first and second embodiments.

Figure 5A:
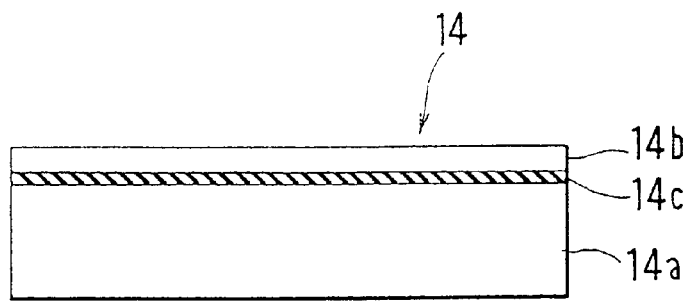
FIGS. 5A to 5H are cross-sectional view showing manufacturing steps of a semiconductor acceleration sensor in a third preferred embodiment.
Figure 5B:
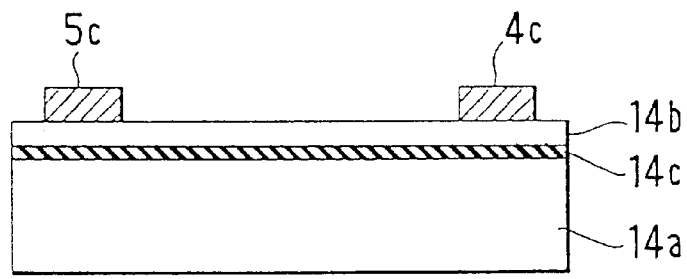
Figure 5C:
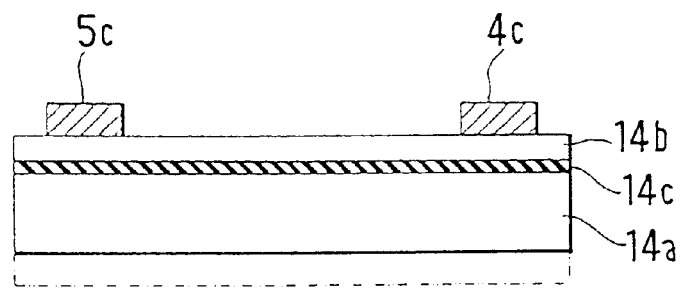
Figure 5D:
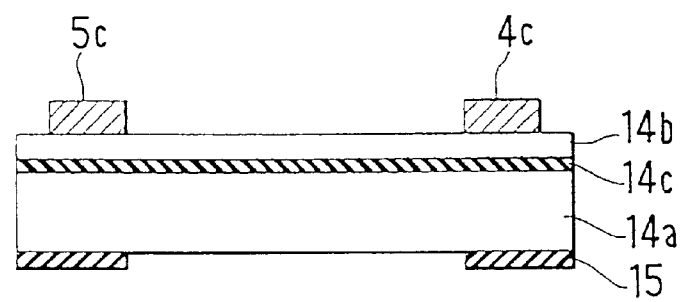
Figure 5E:
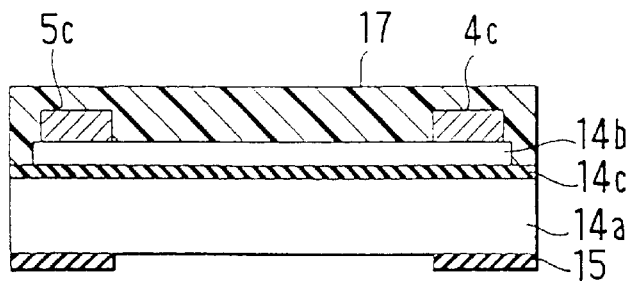

According to this third embodiment, as shown in FIG. 5A, an SOI substrate 14 similar to that in the first embodiment is provided. Here, a single crystal silicon wafer 14a must be p-type silicon to allow electrochemical stop etching to be described later. The single crystal silicon thin film 14b is n-type silicon in which phosphorus is diffused. Next, an electrode pad forming step shown in FIG. 5B, a dimension adjusting step shown in FIG. 5C and a mask forming step shown in FIG. 5D are carried out similarly to the first embodiment. Thereafter, a coating step is performed as shown in FIG. 5E to cover the top surface of the single crystal silicon thin film 14b with a resist 17.

Figure 5F:
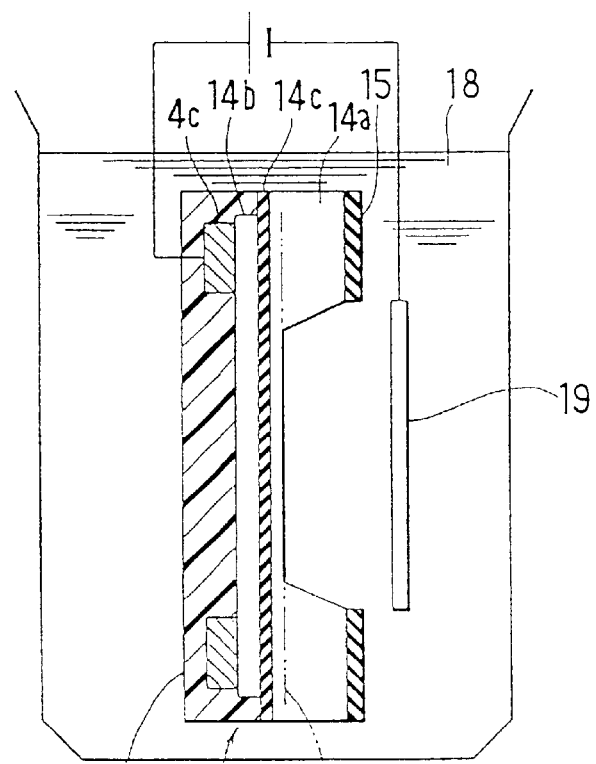

Next, at a first etching step shown in FIG. 5F, well-known electrochemical stop etching is performed. Specifically, a voltage having a positive polarity is applied through, for example, an electrode pad 4c to the single crystal silicon thin film 14b of the SOI substrate 14, and a voltage having a negative polarity is applied to an electrode plate 19 provided in an etchant 18 in a state where the SOI substrate 14 having the mask 15 and resist 17 is immersed in the etchant 18. The application of such voltages causes a depletion layer 20 (indicated by a two-dot chain line for convenience) to spread in the single crystal silicon wafer 14a through the silicon oxide film 14c. As a result, when the etching proceeds to expose the depletion layer 20 in the etchant 18, anodic oxidation occurs to form an anodic oxide film having an extremely low etching rate on the etching surface, thereby stopping the etching substantially. As a result, the thickness of the residual single crystal silicon wafer 14a can be accurately controlled in accordance with the depth of the depletion layer 20 without strict control over the etching time.

Figure 5G:
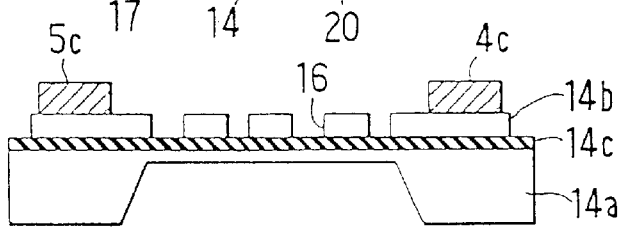
Figure 5H:
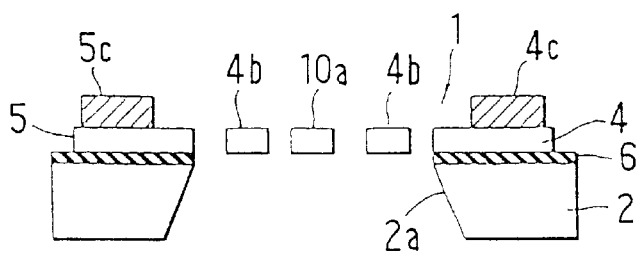

Subsequently, a trench forming step shown in FIG. 5G is performed similarly to the first embodiment with the resist 17 removed to form trenches 16; thereafter, a second etching step is performed using a dry etching apparatus to remove the residual part of the single crystal silicon wafer 14a; and a third etching step is performed using the same dry etching apparatus to remove the silicon oxide film 14c, thereby forming the opening 2a as shown in FIG. 5H eventually. Then, a dicing step is carried out to cut the SOI substrate 14 into sensor chips in a predetermined configuration, thereby completing a basic structure of a semiconductor acceleration sensor 1.

Fourth Embodiment

FIGS. 6A through 6H show a fourth preferred embodiment of the invention which will be described below in points different from the first embodiment.

In the first embodiment, the first etching step utilizing wet etching is performed to form the opening 2a in the silicon wafer 14a (see FIG. 1F) and, thereafter, the second and third etching steps utilizing dry etching are sequentially carried out (see FIGS. 1G and 1H). In the fourth embodiment, all etching steps are carried out in an atmosphere in a vapor phase. Referring to the method of etching in this case, a dry etching apparatus is generally used, and anisotropic dry etching is preferably performed to control the dimension of the opening 2a accurately.

Figure 6A:
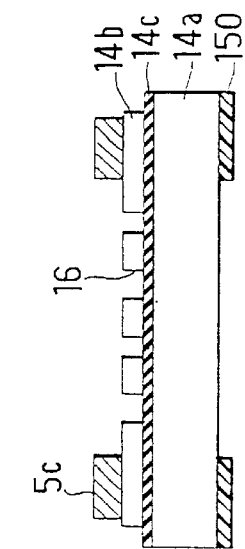
FIGS. 6A to 6H are cross-sectional view showing manufacturing steps of a semiconductor acceleration sensor in a fourth preferred embodiment.
Figure 6B:
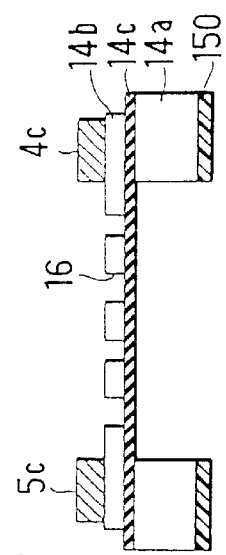
Figure 6C:
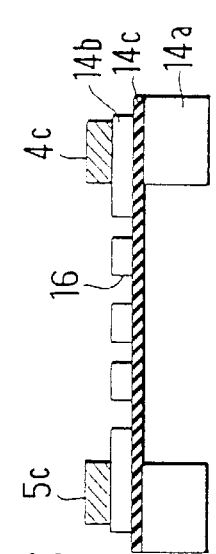
Figure 6D:
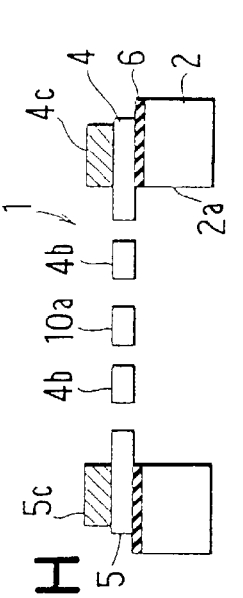
Figure 6E:
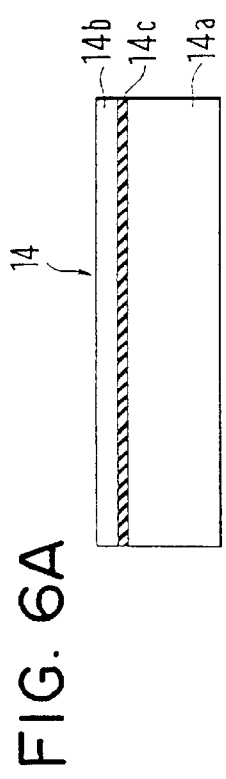

Specifically, in this fourth embodiment, an SOI substrate 14 similar to that in the first embodiment is provided as shown in FIG. 6A. Then, an electrode pad forming step shown in FIG. 6B, a dimension adjusting step shown in FIG. 6C and a mask 6B, the dimension adjusting step shown in FIG. 6C, a mask forming step shown in FIG. 6D and a trench forming step shown in FIG. 6E are carried out substantially similarly to the first embodiment. In this embodiment, however, a resist resistant to dry etching is provided as a mask 150 at the mask forming step as shown in FIG. 6D.

Figure 6F:
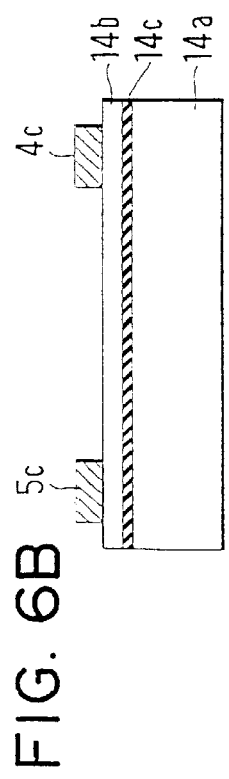
Figure 6G:
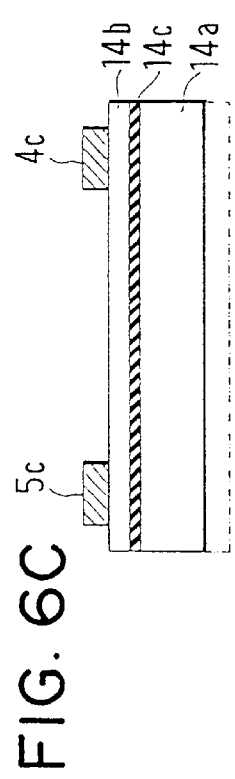
Figure 6H:
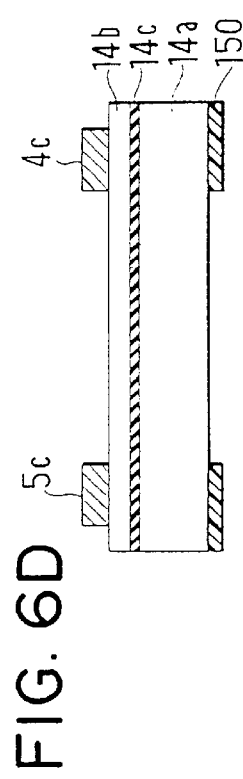

At a first etching step shown in FIG. 6F, anisotropic dry etching is performed on the side of the single crystal silicon wafer 14a where the mask 150 is provided to remove the wafer 14a, thereby exposing the rear surface (lower surface) of the silicon oxide film 14c. Next, as shown in FIG. 6G, ashing is performed to remove the mask 150. Further, at a second etching step shown in FIG. 6H, dry etching is performed from the rear side of the silicon oxide film 14c to remove the silicon oxide film 14c, thereby forming the opening 2a. Then, a dicing step is performed to cut the SOI substrate 14 into sensor chips in a predetermined configuration, thereby completing a basic structure of a semiconductor acceleration sensor 1.

According to the manufacturing method of the fourth embodiment, since the opening 2a can be formed using only dry etching, the manufacturing steps are simplified, and there is no possibility of the sticking of movable portions such as the movable electrodes 10b. When anisotropic dry etching is thus carried out, since the etching proceeds in a direction substantially perpendicular to the surface of the single crystal silicon wafer 14a, there is no need for a mask having large dimensions, and this eliminates the possibility of an increase in the chip size. However, dry etching as in the present embodiment has an etching rate lower than that of wet etching utilizing an aqueous solution of KOH. Therefore, in order to improve throughput, the thickness of the single crystal silicon wafer 14a is preferably adjusted to about 300 μm.

Fifth Embodiment

FIGS. 7A through 7H show a fifth preferred embodiment of the invention which will be described below in points different from the first embodiment.

Figure 7A:
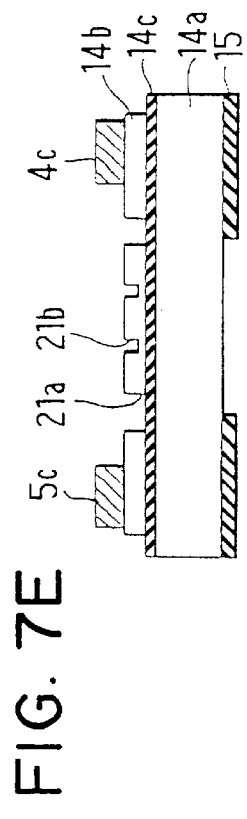
FIGS. 7A to 7H are cross-sectional view showing manufacturing steps of a semiconductor acceleration sensor in a fifth preferred embodiment.
Figure 7B:
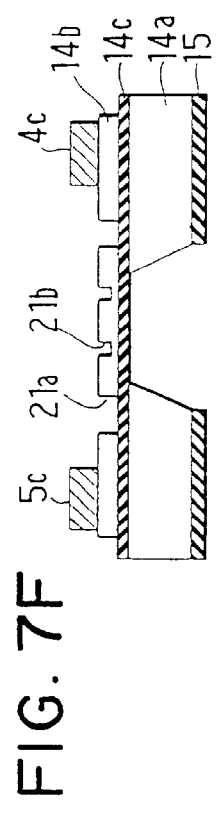
Figure 7C:
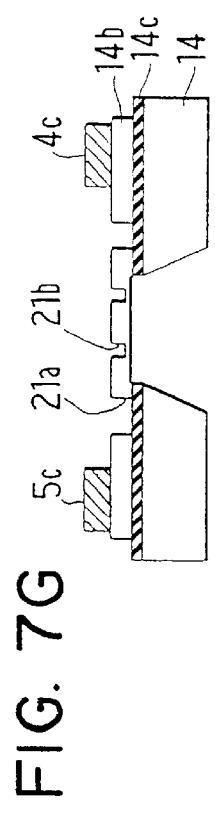
Figure 7D:
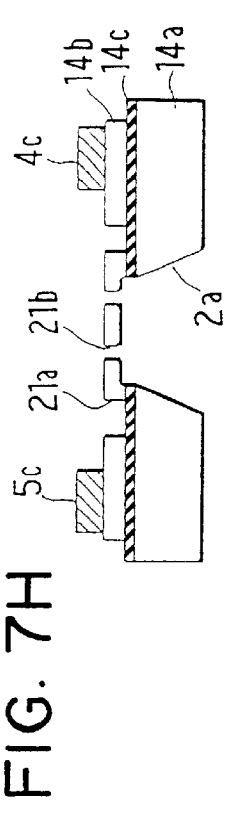

The fifth embodiment is characterized in that the plane configurations of the beam structure 3 and the fixed electrode structures 4 and 5 are designed such that the trench pattern formed on the single crystal silicon thin film 14b has a region having a large trench width and a region having a trench width which is sufficiently smaller than the same. Specifically, an SOI substrate 14 similar to that in the first embodiment is provided as shown in FIG. 7A, and an electrode pad forming step shown in FIG. 7B, a dimension adjusting step shown in FIG. 7C and a mask forming step shown in FIG. 7D are carried out similarly to the first embodiment.

Figure 7E:
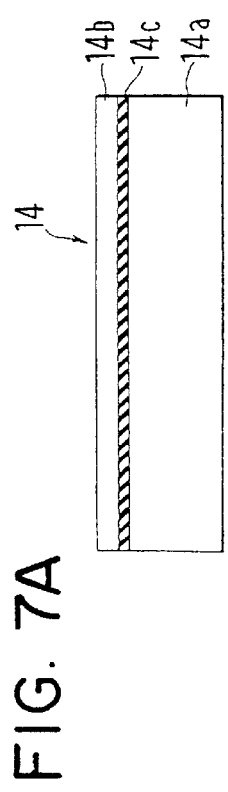

At a trench forming step shown in FIG. 7E, a resist (not shown) resistant to dry etching is formed on the single crystal silicon thin film 14b and the electrode pads 4c, 5c and 11a in a predetermined pattern that results in a difference between trench widths as described above. Anisotropic dry etching is carried out with a dry etching apparatus using this resist as a mask. As a result, a first trench 21a having a large width and a second trench 21b having a width sufficiently smaller than that of the first trench 21a are formed in the single crystal silicon thin film 14b.

During dry etching at the trench forming step, the etchant is sufficiently supplied to the region of the first trench 21a, whereas an amount of etchant supplied to the region of the second trench 21b becomes insufficient. As a result, the substantial etching rate in the region of the second trench becomes lower than that in the region of the first trench 21a. Thus, if etching is terminated when the first trench 21a reaches the silicon oxide film 14c, a part of the single crystal silicon thin film 14b is left at the bottom of the second trench 21b.

Figure 7F:
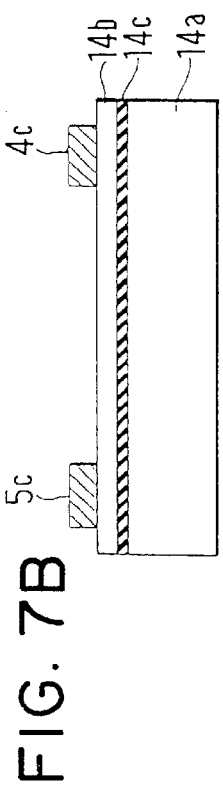
Figure 7G:
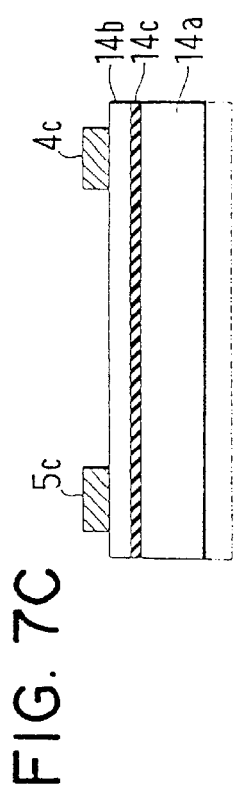
Figure 7H:
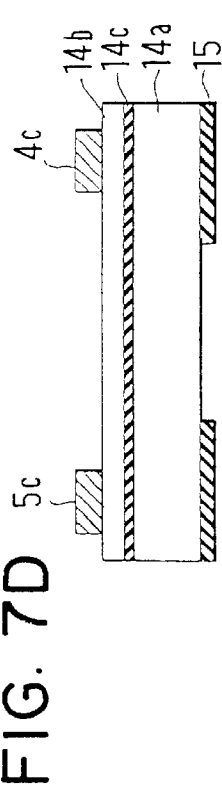

Subsequently, at a first etching step shown in FIG. 7F, selective etching is performed on the single crystal silicon wafer 14a using the mask 15 and, for example, an aqueous solution of KOH. In this case, the silicon oxide film 14c having an etching rate lower than that of silicon is used as an etching stopper. Next, at a second etching step shown in FIG. 7G, dry etching is performed to remove the silicon oxide film 14c from the rear side thereof. Thereafter, at a third etching step shown in FIG. 7H, dry etching is performed to remove the residual single crystal silicon thin film 14b to form an opening 2a.

According to the manufacturing method of the present embodiment, during the execution of the first etching step, the pressure of the etchant can be reliably received by both of the silicon oxide film 14c and the single crystal silicon thin film 14b connected thereto, which eliminates the possibility of the breakage of the single crystal silicon thin film 14b. Since the third etching step as the final step of course employs dry etching, there is no possibility of the sticking of movable portions, which allows the yield of production to be improved.

Sixth Embodiment

FIGS. 8A through 8J show a sixth preferred embodiment of the invention which will be described below in points different from the first embodiment.

Figure 8A:
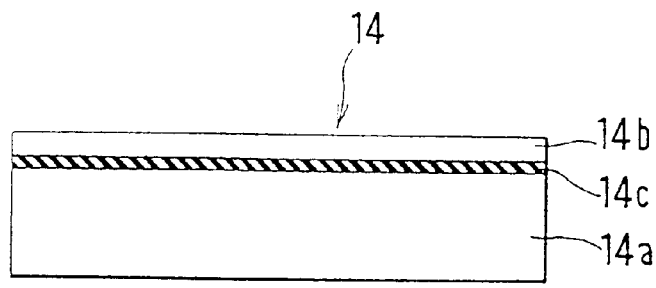
FIGS. 8A to 8J are cross-sectional view showing manufacturing steps of a semiconductor acceleration sensor in a sixth preferred embodiment.
Figure 8B:
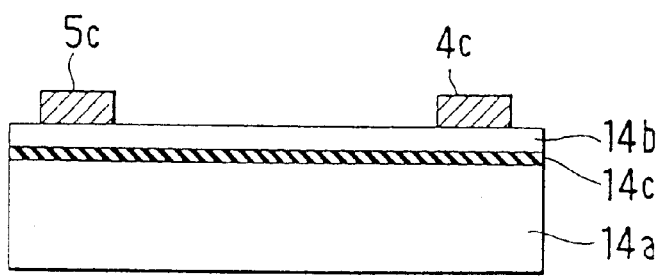
Figure 8C:
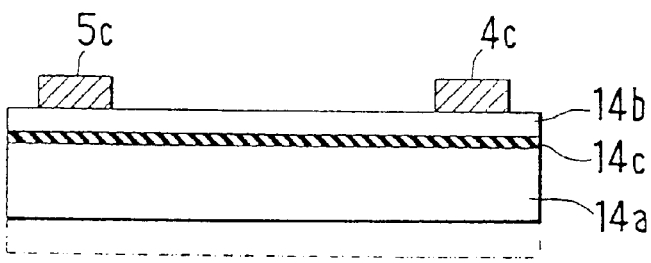
Figure 8D:
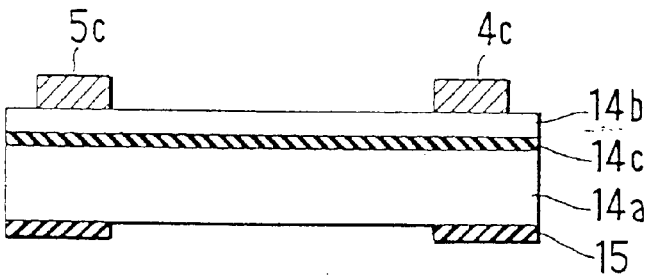
Figure 8E:
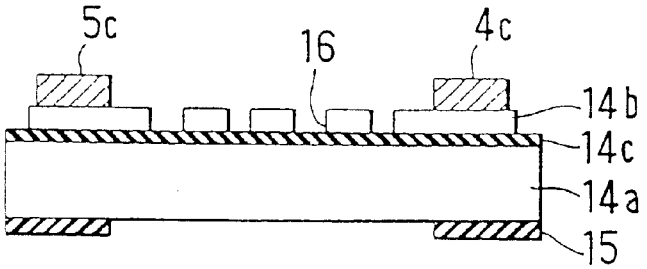

Specifically, an SOI substrate 14 similar to that in the first embodiment is provided as shown in FIG. 8A. Then, an electrode pad forming step shown in FIG. 8B, a dimension adjusting step shown in FIG. 8C, a mask forming step shown in FIG. 8D and a trench forming step shown in FIG. 8E are carried out substantially similarly to the first embodiment.

Figure 8F:
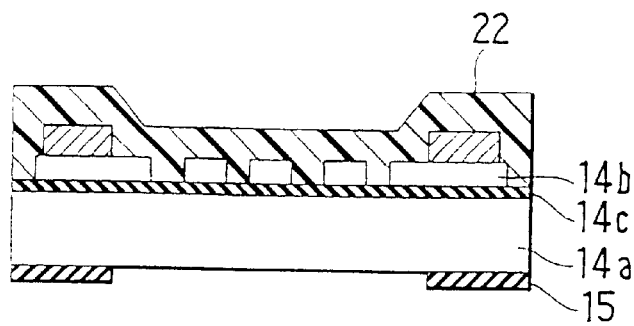
Figure 8G:
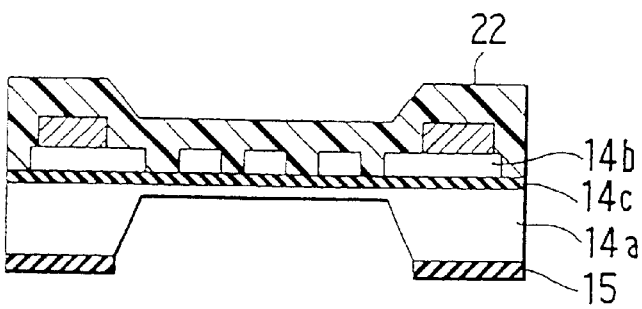
Figure 8H:
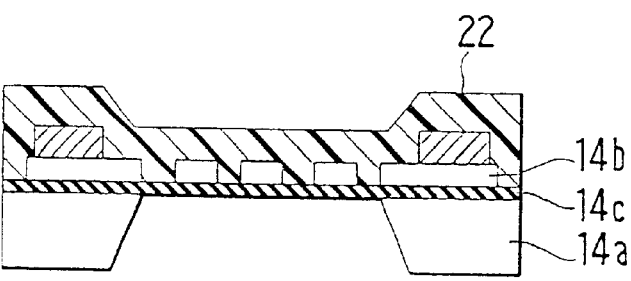
Figure 8I:
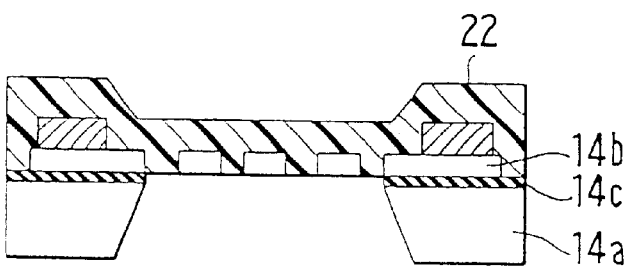
Figure 8J:
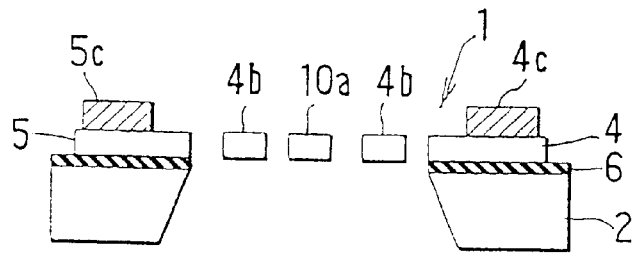

Next, at a surface protection step shown in FIG. 8F, the top surface of the single crystal silicon thin film 14b is covered with a surface protection film 22 made of, for example, organic resist or a polyimide type material which is a material that can be easily peeled. Thereafter, a first etching step shown in FIG. 8G, a second etching step shown in FIG. 8H and a third etching step shown in FIG. 8I are carried out similarly to the first embodiment to form an opening 2a. Further, a protection film removing step shown in FIG. 8J is finally carried out to remove the surface protection film 22. In this case, the surface protection film 22 makes it possible to prevent damage to the single crystal silicon thin film 14b during the manufacture. Further, since the surface protection film 22 is made of an organic resist or a polyimide type material, it can be easily removed in, for example, oxygen plasma (i.e., dry atmosphere). After such a protection film removing step is carried out as a part of the third etching step, a dicing step is performed to cut the SOI substrate 14 into sensor chips in a predetermined configuration, thereby completing a basic structure of a semiconductor acceleration sensor 1. The protection film removing step may be performed after the execution of the dicing step. When the protection film is made of a material that is easily separated from the single crystal thin film 14b, the protection film removing step is easily carried out.

Seventh Embodiment

Movable portions such as the beam structure 3 may be broken not only during the manufacture of the semiconductor acceleration sensor 1 but also during mounting thereof, e.g., during wire bonding. In order to prevent breakage during such a mounting stage, a technique as represented by a seventh embodiment of the invention shown in FIGS. 9A through 9E may be used.

Figure 9A:
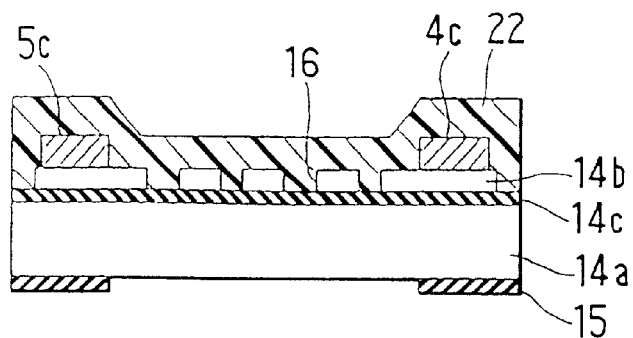
FIGS. 9A to 9E are cross-sectional view showing manufacturing steps of a semiconductor acceleration sensor in a seventh preferred embodiment.
Figure 9B:
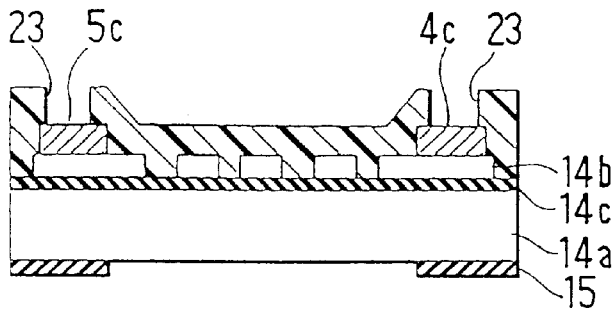

Specifically, according to the seventh embodiment, a surface protection step is carried out to cover the top surface of the SOI substrate 14 with the surface protection film 22 as shown in FIG. 9A and, thereafter, a window forming step is performed as shown in FIG. 9B. At this window forming step, in the regions of the surface protection film 22 associated with the electrode pads 4c, 5c and 11a, windows 23 that extend up to the electrode pads 4c, 5c and 11a are formed (FIG. 9B shows only those associated with the electrode pads 4c and 5c).

Figure 9C:
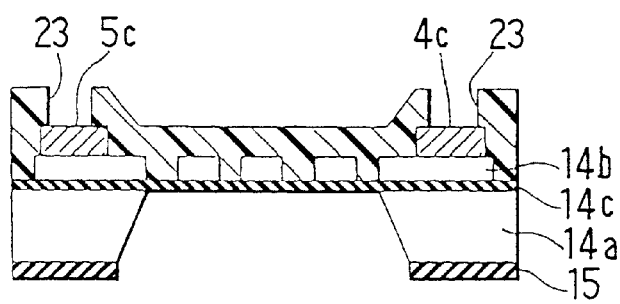
Figure 9D:
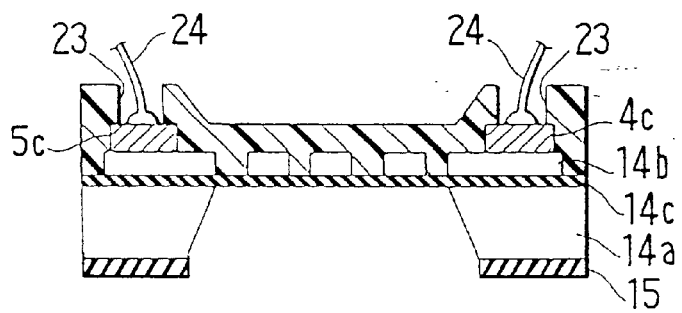
Figure 9E:
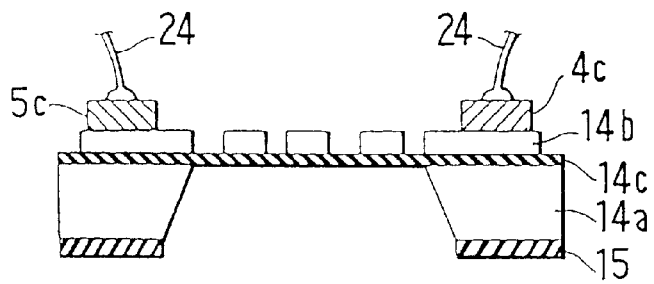

Next, at a first etching step shown in FIG. 9C, selective etching is performed on the single crystal silicon wafer 14a using the mask 15 and, for example, an aqueous solution of KOH. In this case, the silicon oxide film 14c having an etching rate lower than silicon is used as an etching stopper. After such a first etching step, a dicing step is performed to cut the SOI substrate 14 into sensor chips in a predetermined configuration. Further, a wire bonding step shown in FIG. 9D is performed to connect the electrode pads 4c, 5c and 11a to external bonding pads which are not shown with bonding wires 24. Thereafter, as shown in FIG. 9E, the surface protection film 22 is removed using oxygen plasma or the like. Then, a second etching step is performed using a dry etching apparatus to remove the silicon oxide film 14c.

The seventh embodiment as described above allows improved yield because movable portions such as the beam structure 3 can be protected by the surface protection film 22 from damage until a point in time immediately before the mounting of the semiconductor acceleration sensor 1. With the configuration according to this embodiment, since the surface protection film 22 is provided, the first etching step can provide sufficient strength without leaving the single crystal silicon thin film 14b with a predetermined thickness. It is therefore required at the first etching step only to perform etching until the silicon oxide film 14c is exposed, which makes it possible to simplify the manufacturing steps.

While the sixth and seventh embodiments have a configuration wherein the surface protection film 22 is removed using oxygen plasma, another method is possible wherein the film is irradiated with ultraviolet rays in an ozone atmosphere. Since this eliminates the need for charging up when oxygen plasma is used, the sticking of the movable electrodes 10a and 10b to the fixed electrodes 4b and 5b can be suppressed to a higher degree.

Eighth Embodiment

In each of the above-described embodiments, dry etching is carried out at the trench forming step on the SOI substrate 14 to form the trenches 16 or trenches 21a and 21b that extend up to the silicon oxide film 14c. It is known however the regions at the bottom of the trenches in contact with the silicon oxide film 14c are liable to have an undesirable configuration in such a case. Specifically, when the trenches 16 are formed using dry etching as in the first through fourth embodiments and sixth and seventh embodiments, for example, protrusions 25 as shown in FIG. 10A can be formed at the lowermost parts of the fixed electrodes 4b and 5b or movable electrodes 10a and 10b which are defined by the trenches 16. Such protrusions 25 are preferably removed because they can increase the error of the capacity between the fixed electrodes 4a and 4b and movable electrodes 10a and 10b.

Under such circumstances, according to the eighth embodiment, after the execution of the dry etching to remove the silicon oxide film 14c, an auxiliary etching step is carried out to perform isotropic dry etching on the single crystal silicon thin film 14b from below. As a result, undesirable features as described above are removed as shown in FIG. 10B. This makes it possible to prevent the deterioration of the detecting accuracy of the semiconductor acceleration sensor 1 attributable to any increase in the error of the capacity between the fixed electrodes 4a and 4b and movable electrodes 10a and 10b. By setting the etching rate of the auxiliary etching step and the etching rate of the dry etching step for removing the silicon oxide film 14c such that the difference between them becomes small, those dry etching steps can be performed continuously without changing the etching conditions of the dry etching apparatus, which allows those steps to be simplified.

Ninth Embodiment

A description will now be made with reference to FIGS. 11 through 17 on a ninth preferred embodiment which is an application of the invention to a semiconductor acceleration sensor 101 shown in FIGS. 11 and 12.

Figure 12:
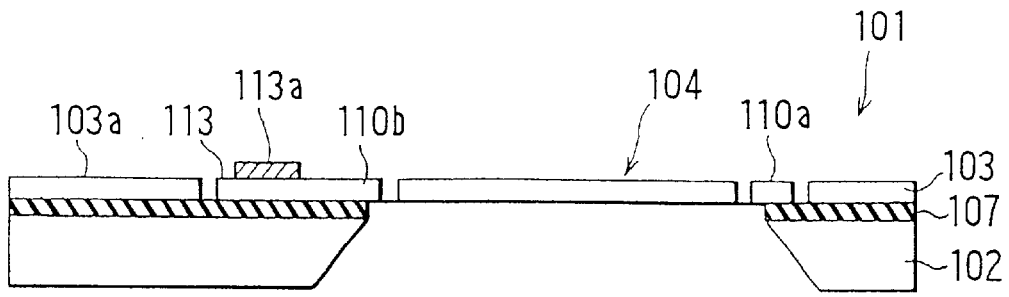
FIG. 12 is a cross-sectional view taken along a XII—XII line in FIG. 11.

Referring to FIGS. 11 and 12, a support substrate 102 made of, for example, single crystal silicon has a configuration in the form of a rectangular frame having an opening 102a. A beam structure 104 and a pair of fixed electrode structures 105 and 106 formed on a single crystal silicon layer 103 on the upper surface of the support substrate with an insulation layer 107 constituted by a silicon oxide film interposed therebetween.

The beam structure 104 has a configuration in which both ends of a mass portion 108 in the form of a rectangular bar are integrally connected to anchor portions 110a and 110b through rectangular frame-like beam portions 109a and 109b. The anchor portions 110a and 110b are supported on opposite sides of the support substrate 102 with the insulation film 107 interposed therebetween. Thus, the mass portion 108 and beam portions 109a and 109b face the opening 102a of the support substrate 102. The beam portions 109a and 109b have the function of a spring in that they cause the mass portion 108 to be displaced in a direction indicated by an arrow X in FIG. 11 when subjected to acceleration having a component in the same direction and cause it to return to the initial state as the acceleration stops.

Further, the beam structure 104 has, for example, a plurality of movable electrodes 111a and 111b which are integral with the mass portion 108 and protrude from each side thereof in a direction orthogonal thereto, such that the movable electrodes 111a and 111b also face the opening 102a of the support substrate 102. While a plurality of movable electrodes 111a and 111b are actually provided, FIG. 11 shows two each for simplicity. Each of the movable electrodes 111a and 111b has a bar-like configuration with a rectangular section, and is formed with a plurality of rectangular through holes 112. The through holes 112 provide a configuration having the so-called Rahmen structure in which a plurality of rectangular frame-shaped bodies are linearly connected.

A movable electrode wiring portion 113 integrally connected to the anchoring portion 110b of the beam structure 104 is formed on the support substrate 102 with the insulation film 107 interposed therebetween. An electrode pad 113a for wire bonding is formed from, for example, aluminum in a predetermined position on the wiring portion 113.

The fixed electrode structure 105 includes, as integral parts thereof, a fixed electrode wiring portion 105a formed on the support substrate 102 with the insulation film 107 interposed therebetween and a plurality of first fixed electrodes 105b provided in parallel with one side of the movable electrodes 111a at a predetermined detection gap. Each of the fixed electrodes 105b is cantilevered on the fixed electrode wiring portion 105a. Thus, the first fixed electrodes 105b face the opening 102a of the support substrate 102.

The fixed electrode structure 106 includes, as integral parts thereof, a fixed electrode wiring portion 106a formed on the support substrate 102 with the insulation film 107 interposed therebetween and a plurality of second fixed electrodes 106b provided in parallel with one side of the movable electrodes 111b (the side on the same plane as the side opposite to the detection gap side of the movable electrodes 111a) at a predetermined detection gap. Each of the fixed electrodes 106b is cantilevered on the fixed electrode wiring portion 106a. Thus, the second fixed electrodes 106b face the opening 102a of the support substrate 102.

While a plurality of each of the first and second fixed electrodes 105b and 106b are actually provided, FIG. 11 shows only two each for simplicity. Each of the first and second fixed electrodes 105b and 106b has a bar-like configuration having a rectangular section, and is formed with a plurality of rectangular through holes 114. The through holes 114 provide a configuration having the so-called Rahmen structure in which a plurality of rectangular frame-shaped bodies are linearly connected. Electrode pads 105c and 106c for wire bonding are formed from aluminum in predetermined positions on the fixed electrode wiring portions 105a and 106a.

The single crystal silicon layer 103 extending at the periphery of the support substrate 102 serves as a shielding thin film 103a. The shielding thin film 103a, the beam structure 104 and the movable electrode wiring portion 113 are isolated from each other by an insulation trench 115. The shielding thin film 103a and the fixed electrode wiring portions 105a and 106a are isolated from each other by insulation trenches 116 and 117. For example, two electrode pads 103b for wire bonding are formed from aluminum on the shielding thin film 103a.

In the present embodiment, impurity is diffused in the support substrate 102 and single crystal silicon layer 103 at a step of the manufacture of the semiconductor acceleration sensor 101 to set their specific resistance at relatively low values of 3 Ω·cm or less, preferably 1 Ω·cm or less. The specific values of resistance thus set determine values of resistance of the fixed electrode wiring portions 105a and 106a, the first and second fixed electrodes 105b and 106b, the movable electrodes 111a and 111b, the movable electrode wiring portion 113 and the like.

When acceleration including a component in the direction of the arrow X in FIG. 11 is applied to the semiconductor acceleration sensor 101 having the above-described configuration, the mass portion 108 is displaced in the direction of the arrow X. The amount of displacement depending on the acceleration is determined by the mass of the mass portion 108, the restoring forces of the beam portions 109a and 109b and an electrostatic force acting between the movable electrodes 111a and 111b and the respective first and second fixed electrodes 105b and 106b when a voltage is applied.

In this case, a first capacitor is formed between the movable electrodes 111a and first fixed electrodes 105b, and a second capacitor is formed between the movable electrodes 111b and second fixed electrodes 106b. Each capacity of the first and second capacitors changes on a differential basis in accordance with displacements of the movable electrodes 111a and 111b caused by acceleration that acts on the mass portion 108. Such a change in the capacity can be output through the electrode pads 105c, 106c and 113a as a change in charge to detect the acceleration. The first and second capacitors in this embodiment are set to have equal capacity when no acceleration is applied.

Figure 13:
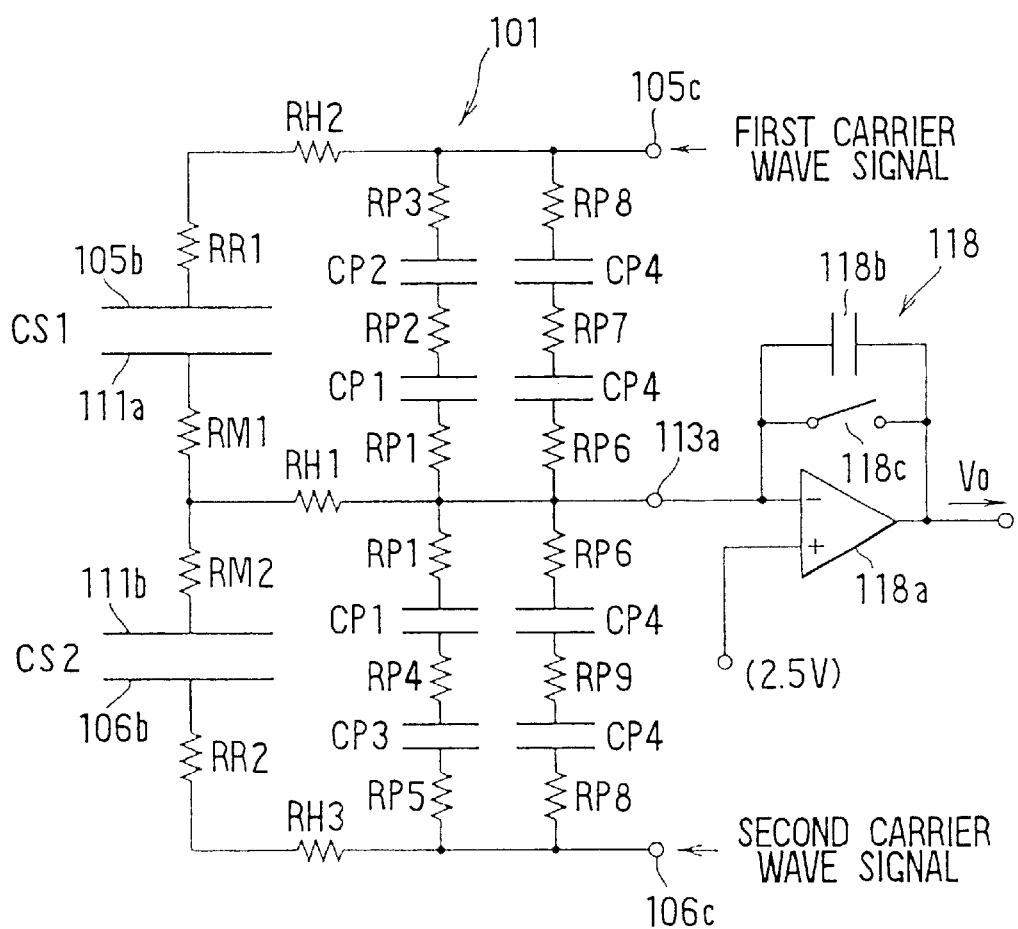
FIG. 13 is a diagram showing a capacity change detection circuit configuration and an equivalent circuit of the semiconductor acceleration sensor shown in FIGS. 11 and 12.

FIG. 13 shows a circuit configuration of a capacity change detection circuit for detecting changes in the capacity as described above. FIG. 13 represents the semiconductor acceleration sensor 101 with an equivalent circuit. Specifically, the meanings of the reference symbols in the equivalent circuit of the semiconductor acceleration sensor 101 shown in FIG. 13 are as follows.

CS1: the first capacitor between the movable electrodes 111a and the first fixed electrodes 105b;

CS2: the second capacitor between the movable electrodes 111b and the second fixed electrodes 106b;

RM1: the resistance of the single crystal silicon layer 103 in the regions of the movable electrodes 111a;

RM2: the resistance of the single crystal silicon layer 103 in the regions of the movable electrodes 111b;

RR1: the resistance of the single crystal silicon layer 103 in the regions of the first fixed electrodes 105b;

RR2: the resistance of the single crystal silicon layer 103 in the regions of the second fixed electrodes 106b;

RH1: the resistance of the single crystal silicon layer 103 in the region extending from the bases of the movable electrodes 111a and 111b to the electrode pad 113a (the mass portion 108 and the movable electrode wiring portion 113);

RH2: the resistance of the single crystal silicon layer 103 in the region extending from the bases of the first fixed electrodes 105b to the electrode pad 105c (the fixed electrode wiring portion 105a);

RH3: the resistance of the single crystal silicon layer 103 in the region extending from the bases of the second fixed electrodes 106b to the electrode pad 106c (the fixed electrode wiring portion 106a);

RP1: the parasitic resistance of the single crystal silicon layer 103 in the region extending from the electrode pad 113a to the insulation trench 115 (the movable electrode wiring portion 113);

CP1: parasitic capacitor formed by the insulation trench 115 at the movable electrode wiring portion 113;

RP2: the parasitic resistance of the single crystal silicon layer 103 between the insulation trenches 115 and 116;

CP2: parasitic capacitor formed by the insulation trench 116 at the fixed electrode wiring portion 105a;

RP3: the parasitic resistance of the single crystal silicon layer 103 in the region extending from the electrode pad 105c to the insulation trench 116 (the fixed electrode wiring portion 105a);

RP4: the parasitic resistance of the single crystal silicon layer 103 between the insulation trenches 115 and 117;

CP3: parasitic capacitor formed by the insulation trench 117 at the fixed electrode wiring portion 106a;

RP5: the parasitic resistance of the single crystal silicon layer 103 in the region extending from the electrode pad 106c to the insulation trench 117 (the fixed electrode wiring portion 106a);

RP6: the parasitic resistance of the single crystal silicon layer 103 in the longitudinal region extending from the electrode pad 113a to the insulation film 107 (the movable electrode wiring portion 113);

CP4: parasitic capacitor between the electrode pad 113a and support substrate 102;

RP7: the parasitic resistance of the support substrate 102 in the region extending from the electrode pad 105c to the region of the electrode pad 113a;

RP8: the parasitic resistance of the single crystal silicon layer 103 in the longitudinal region extending from the electrode pad 105a or 106c to the insulation film 107 (the fixed electrode wiring portion 105a or 106a); and RP9: the parasitic resistance of the support substrate 102 in the region extending from the electrode pad 106c to the region of the electrode pad 113a.

Figure 14:
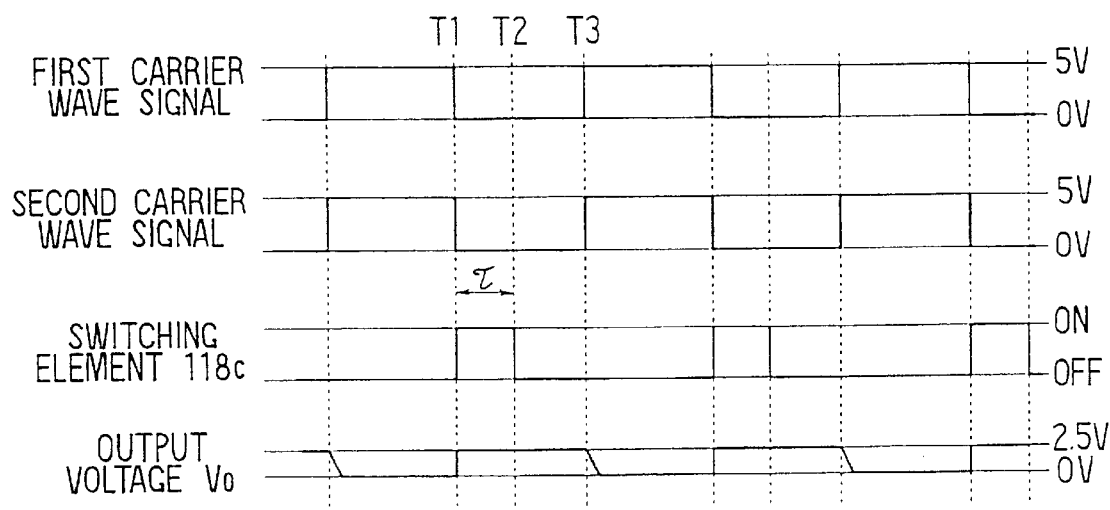
FIG. 14 shows a timing chart for explaining an operation of the capacity change detection circuit shown in FIG. 13.

A first carrier wave signal (having a frequency of, for example, 100 KHz and a voltage level of, for example, 5V) constituted by a rectangular wave as shown in FIG. 14 is applied to the electrode pad 105c (i.e., the first fixed electrode 105b), whereas a second carrier wave signal (having a frequency of, for example, 100 KHz and a voltage level of, for example, 5V; see FIG. 14) constituted by a rectangular wave in a phase 180° different from that of the first carrier wave signal is applied to the electrode pad 106c (i.e., the second fixed electrode 106b). Although not specifically shown, the first and second carrier wave signals are formed in synchronism with a clock signal from the same oscillation circuit.

As a result of the application of the carrier wave signals described above, the potential level of the electrode pad 113a (i.e., the movable electrodes 111a and 111b) becomes a level which is in accordance with the capacity of the first and second capacitors CS1 and CS2, and the potential level is detected by a switched capacitor circuit 118.

The switched capacitor circuit 118 is a combination of an operational amplifier 118a, a feedback capacitor 118b and a switching element 118c which are connected as illustrated in FIG. 13. The operational amplifier 118a has a configuration in which a signal from the electrode pad 113a (a signal indicating the potential level of the movable electrodes 111a and 111b) is input to an inverted input terminal thereof and in which a voltage signal at 2.5 V (which corresponds to the potential level that appears at the electrode pad 113a when the first and second capacitors CS1 and CS2 have the same capacity) is supplied to a non-inverted input terminal thereof. The switching element 118c is turned on and off by trigger signals generated in synchronism with the clock signal from the oscillation circuit which is not shown. As shown in FIG. 14, the switching element 118c is turned on for a predetermined period τ (a period shorter than ½ period of the first carrier wave signal) at the time of a fall of the first carrier wave signal (the time of a rise of the second carrier wave signal).

The capacity detecting circuit shown in FIG. 13 is assumed to operate as follows.

Figure 15A:
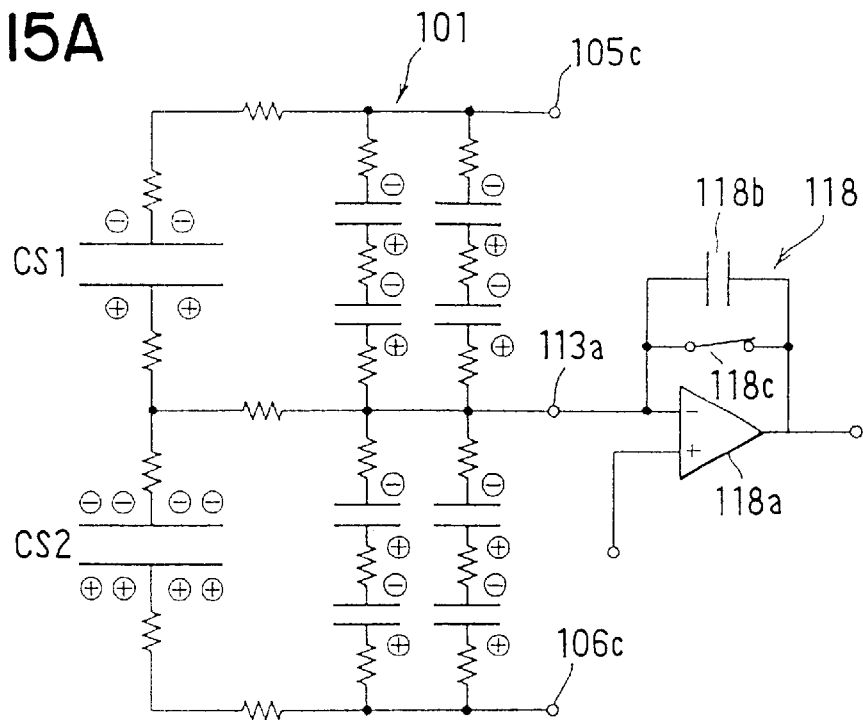
FIGS. 15A and 15B are schematic views for explaining charge movements of the capacity change detection circuit.

When the first and second capacitors CS1 and CS2 have the same capacity, voltages of 0 V, 5 V and 2.5 V are respectively applied to the first fixed electrode 105b, second fixed electrode 106b and movable electrodes 111a and 111b at time T1 in the timing chart of FIG. 14. As a result, the capacitors CS1 and CS2 have charge distribution as shown in FIG. 15A. At this time, the switching element 118c is turned on, so that an output voltage Vo of the switched capacitor circuit 118 becomes 2.5 V.

When the switching element 118 c is turned off at time T2 which is reached when the period τ elapses since the time T1, the charge distribution at the first and second capacitors CS1 and CS2 is unchanged from that shown in FIG. 15A because there is no change in the voltage applied to each of the fixed electrodes 105b and 106b. Therefore, the output voltage Vo is kept unchanged at 2.5 V.

Figure 15B:
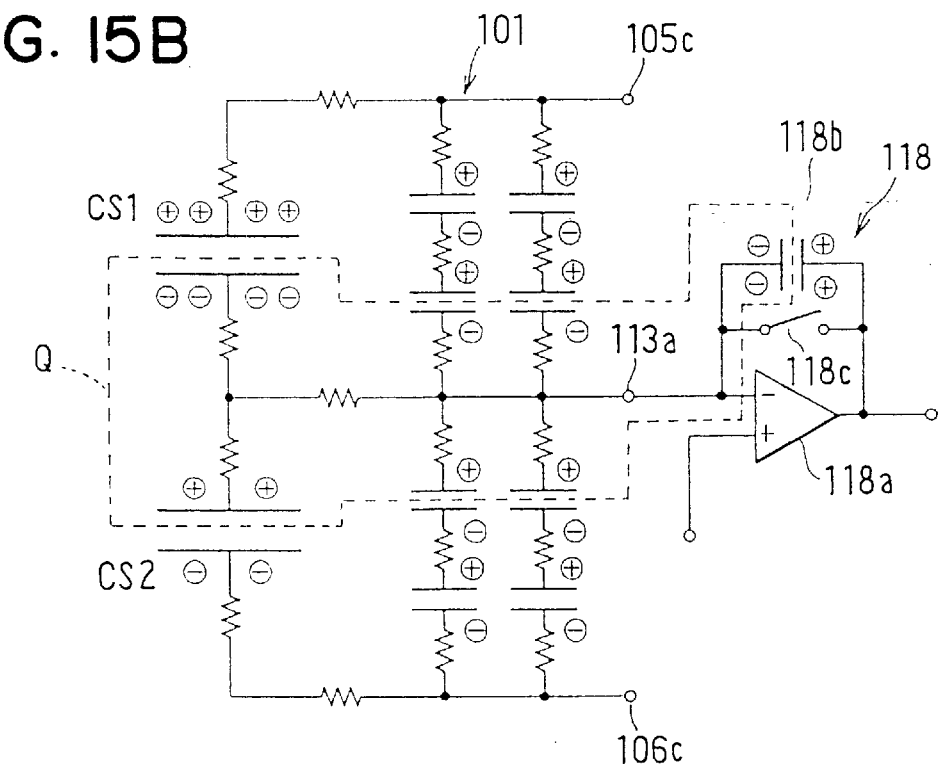

When time T3 comes thereafter, the first and second capacitors CS1 and CS2 come to have charge distribution as shown in FIG. 15B as a result of an inversion to a state in which voltages of 5 V and 0 V are applied to the first and second fixed electrodes 105b and 106b, respectively. At this time, as the total charge in the region enclosed by the broken line Q in FIG. 15B becomes zero, the output voltage Vo gradually decreases in response to discharge through the feedback capacitor 118b. In this case, the level of the output voltage Vo changes depending on a differential amount of change between the capacities of the first and second capacitors CS1 and CS2, i.e., the magnitude of acceleration that acts on the mass portion 108. Therefore, the magnitude of acceleration can be detected utilizing the output voltage Vo.

When a voltage is applied between the movable electrodes 111a and 111b and first and second fixed electrodes 105b and 106b, at sides of the movable electrodes 111a and 111b, charges indicated by the products of the capacities of the first and second capacitors CS1 and CS2 and the potential differences between the movable electrodes and the respective fixed electrodes 105b and 106b are generated. The charges thus generated have time constants that depend on the resistance and capacity of the respective paths from the electrode pad 113a to the sides of the movable electrodes 111a and 111 and the resistance and capacity of the paths from the electrode pads 105c and 106c to the sides of the first and second fixed electrodes 105b and 106b. However, since the above paths include resistance factors as shown in FIG. 13 (RM1, RM2, RR1, RR2, RH1 through RH3, RP1 through RP9), undesirable effects of increases in the time constants attributable to those factors are unavoidable.

Therefore, when the specific resistances of the support substrate 102 and single crystal silicon layer 103 that determine the magnitudes of the above resistance factors are relatively high, i.e., when the time constants are large, phenomena as described in the following items (1), (2) and (3) occur in combination.

Figure 16A:
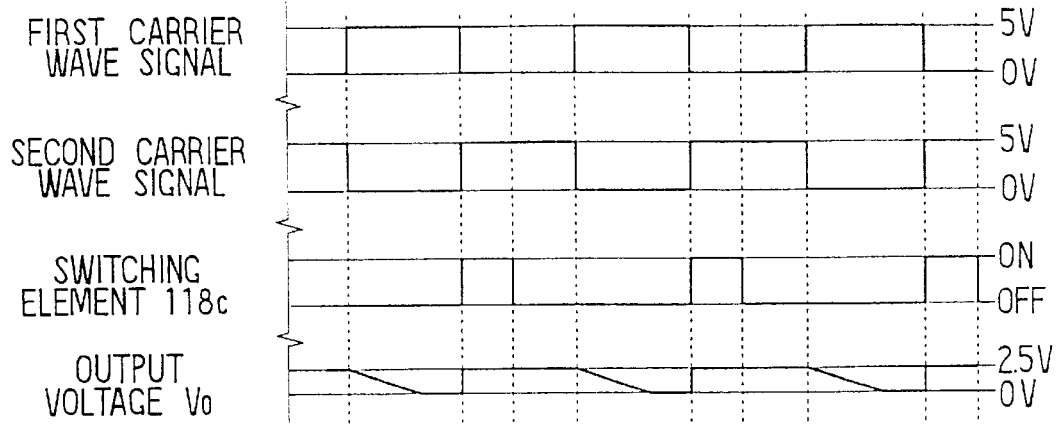
FIGS. 16A to 16C are timing charts for explaining phenomena in which detection characteristics deteriorate.

(1) The movement of charges between the first and second capacitors CS1 and CS2 and the feedback capacitor 118b is delayed by the effect of the time constants. Therefore, the amplitude of the output voltage Vo will be different from a value what should be achieved as shown in FIG. 16A.

Figure 16B:
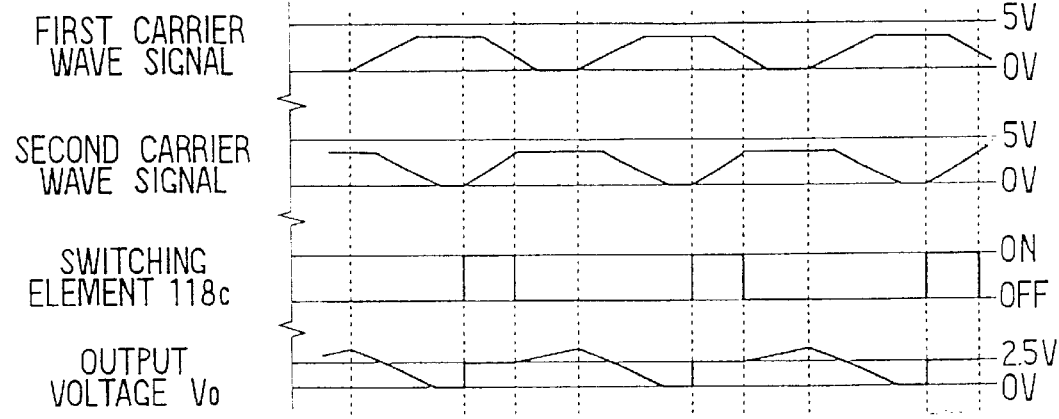

(2) Since the first and second carrier wave signals applied to the fixed electrodes 105b and 106b are also affected by the time constants, the voltages applied to the fixed electrodes 105b and 106b decrease below values which should be achieved as shown in FIG. 16B. As a result, the value of the output voltage Vo also deviates from the value which should be achieved.

Figure 16C:
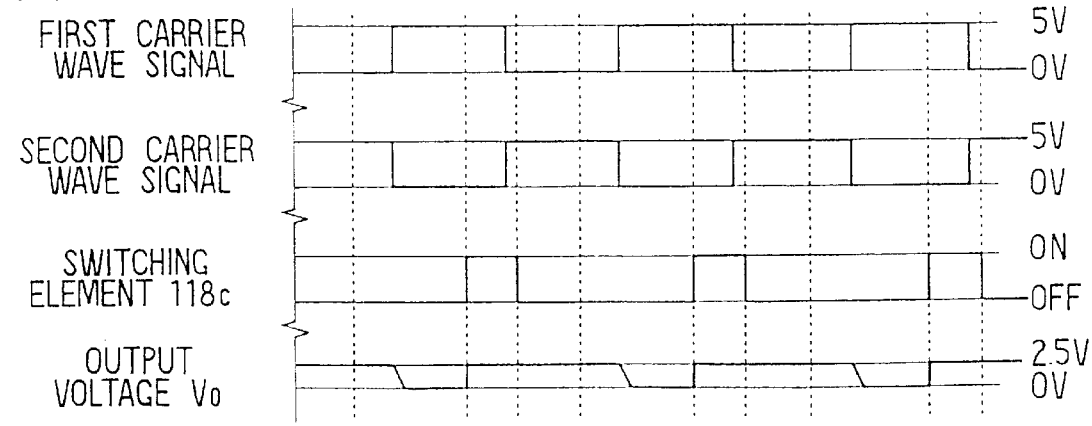

(3) As a result of the effect of the time constants on the first and second carrier wave signals, as shown in FIG. 16C, a phase difference occurs between the on and off times of the first and second carrier wave signals and the switching element 118c, which causes the output voltage Vo to deviate from the value which should be achieved.

In summary, when the specific resistances of the support substrate 102 and single crystal silicon layer 103 are relatively high, the phenomena described in (1), (2) and (3) above can occur in combination and, as a result, the magnitude of fluctuation of the output voltage Vo can increase to deteriorate acceleration detecting characteristics.

As opposed to this, in the present embodiment, the specific resistances of the support substrate 102 and single crystal silicon layer 103 are set at relatively low values of 3 Ω·cm or less, preferably 1 Ω·cm or less as previously described. That is, in the present embodiment, relatively low values are set not only for the specific resistance of the single crystal silicon layer 103 that determines the resistances RM1, RM2, RR1, RR2 and RH1 through RH3 and the parasitic resistances RP1 through RP6, RP8 and RP9 shown in FIG. 13 but also for the specific resistance of the support substrate 102 that determines the parasitic resistance RP7 shown in FIG. 13. This makes it possible to minimize the influence of the time constants attributable to the presence of the resistances RM1, RM2, RR1, RR2, RH1 through RH3 and the parasitic resistances RP1 through RP9, thereby reducing the magnitude of fluctuation of the output voltage Vo.

Figure 17:
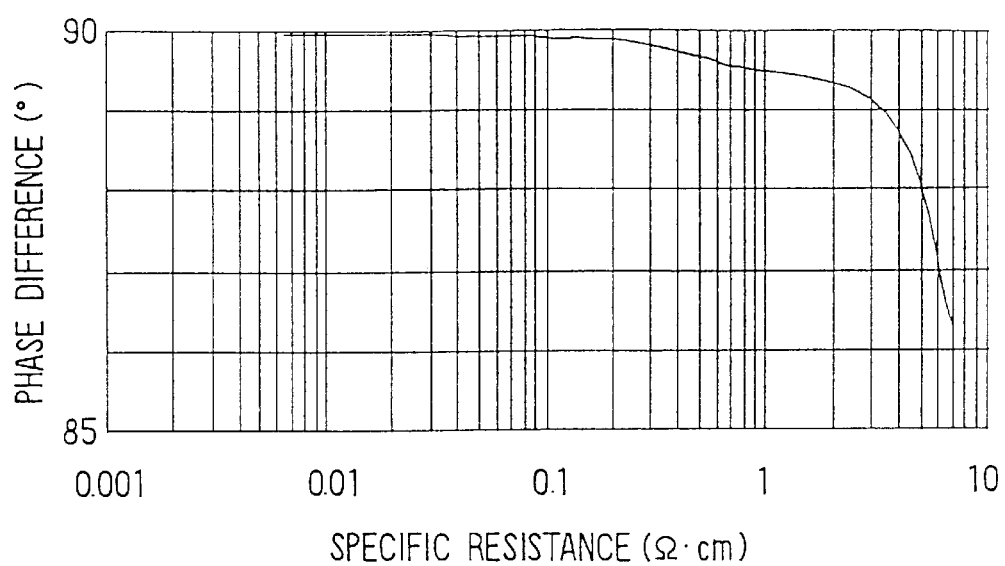
FIG. 17 is a characteristic view showing a relationship between a specific resistance, voltage, and phase difference.

FIG. 17 shows a relationship between the specific resistances of the support substrate 102 and single crystal silicon layer 103 and the phase difference in voltage and current between the capacitors CS1 and CS2 when a voltage is applied thereto. This figure indicates that the amount of the phase shift of voltage and current attributable to the time constants as described above can be kept within 1 degree (a phase difference in the range from 89° to 90°) which is an allowable range by setting the specific resistances at 3 Ω·cm or less.

As described above, the present embodiment makes it possible to improve acceleration detecting characteristics with a simple configuration which is obtained only by setting the specific resistances of the support substrate 102 and single crystal silicon layer 103 at low values. Further, since acceleration is detected using the first and second capacitors CS1 and CS2 whose capacities change on a differential basis, the apparent magnitude of variation of the capacity relative to the magnitude of the acceleration to be detected increases to provide an improved signal to noise ratio.

Tenth Embodiment

Figure 18:
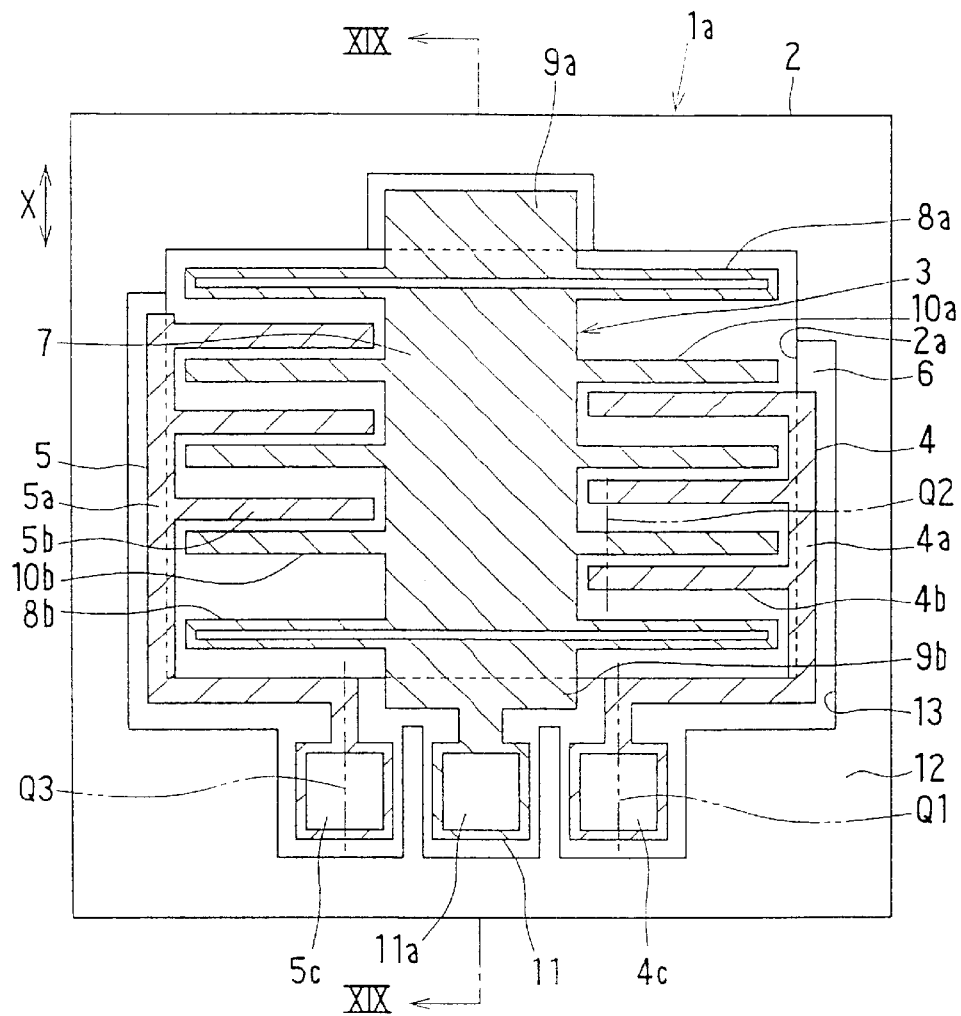
FIG. 18 is a plan view showing a semiconductor acceleration sensor in a tenth preferred embodiment.
Figure 19:
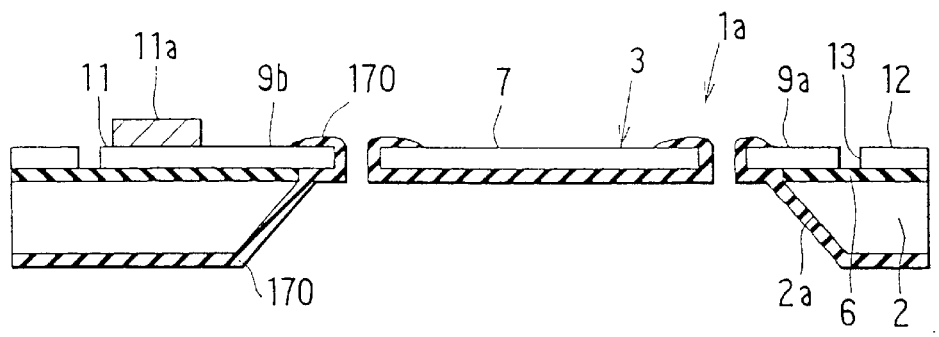
FIG. 19 is a cross-sectional view taken along a XIX—XIX line in FIG. 18.

FIGS. 18 and 19 show a capacity type semiconductor acceleration sensor 1a according to a tenth preferred embodiment of the invention. In FIGS. 18 and 19, parts identical to those in the semiconductor acceleration sensor 1 according to the first embodiment are indicated by like reference numbers.

In the semiconductor acceleration sensor 1a of the present embodiment, an impurity is diffused in advance in single crystal silicon that forms the beam structure 3 and fixed electrode structures 4 and 5 in order to reduce the specific resistances thereof.

Figure 20A:
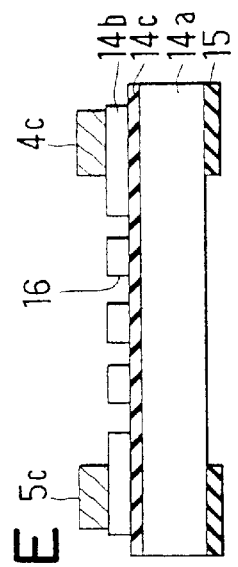
FIGS. 20A to 20H are cross-sectional view showing manufacturing steps of the acceleration sensor in the tenth embodiment.
Figure 20B:
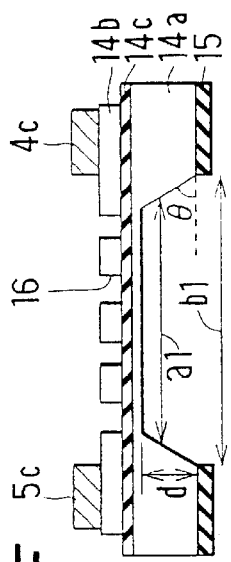
Figure 20C:
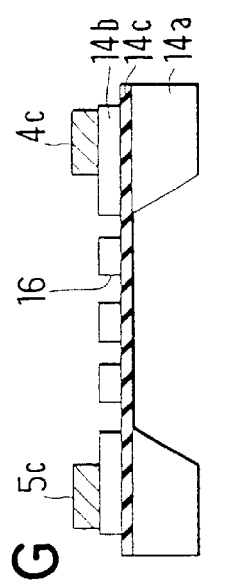
Figure 20D:
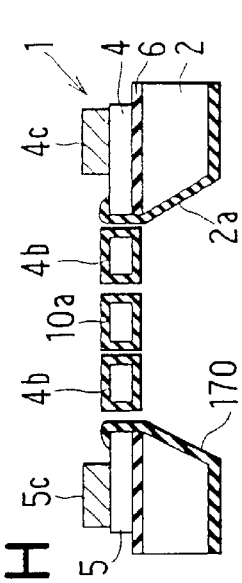
Figure 20E:
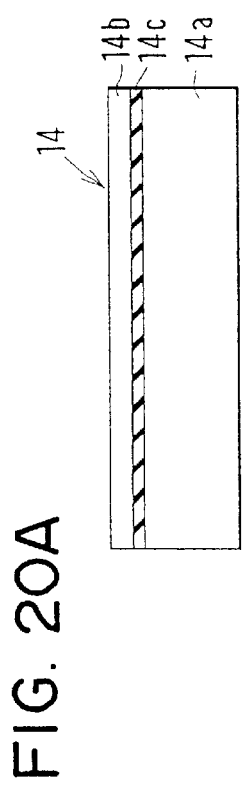
Figure 20F:
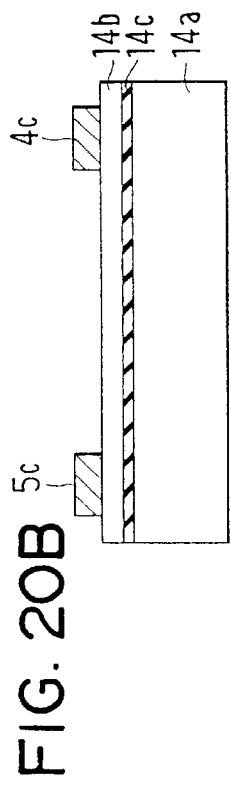
Figure 20G:
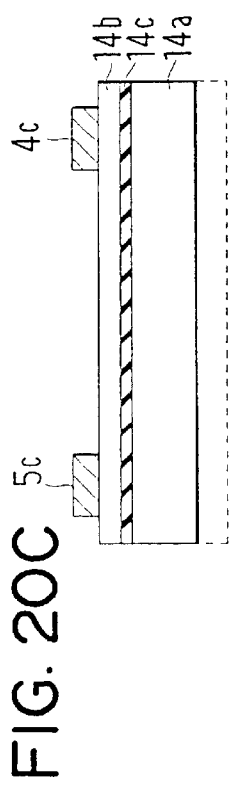
Figure 20H:
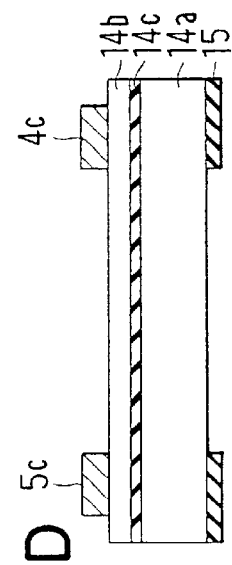

As shown in FIG. 19 and FIG. 20H to be described later, a hydrophobic thin film 170 constituted by an organic thin film such as a fluorocarbon film or by an inorganic thin film made of ammonium fluoride ($NH_4F$) is formed on the surface of the support substrate 2 opposite to the side of the insulation film 6 and on sides of the beam structure 3 and fixed electrode structures 4 and 5 which are facing each other. The thin film 17 is a film which has a low hydrophobic property, i.e., low surface energy and which preferably has a contact angle with water at 70 degrees or more. Usable films as the thin film 17 are a fluorine type thin film including fluorine and the like. The configuration is otherwise substantially the same as that of the semiconductor acceleration sensor 1 of the first embodiment.

Steps for manufacturing a semiconductor acceleration sensor 1a as described above will now be described with reference to FIGS. 20A through 20H in points where differences from the first embodiments exist.

First, an SOI substrate 14 is provided which is composed of a single crystal silicon wafer 14a, a silicon oxide film 14b and a single crystal silicon thin film as shown in FIG. 20A. The single crystal silicon wafer 14a used in the present embodiment has a plane orientation set at (100) on the surface thereof, has a thickness of at least about 300 μm, and has a low impurity concentration. The structure of the SOI substrate is otherwise the same as that in the first embodiment. The single crystal silicon thin film 14b has a plane orientation of (100) on the surface thereof and is set at a thickness of, for example, about 1 μm. For example, phosphorus is diffused in the single crystal silicon thin film 14b at a high concentration (about $1 \times 10^{19}/cm^3$ or more) to reduce the specific resistance thereof and to provide ohmic contact to the electrode pads 4c, 5c and 11a. The steps shown in FIGS. 20B through 20G are substantially the same as those shown in FIGS. 1B through 1G and will not be described here to avoid duplication.

Figure 21:
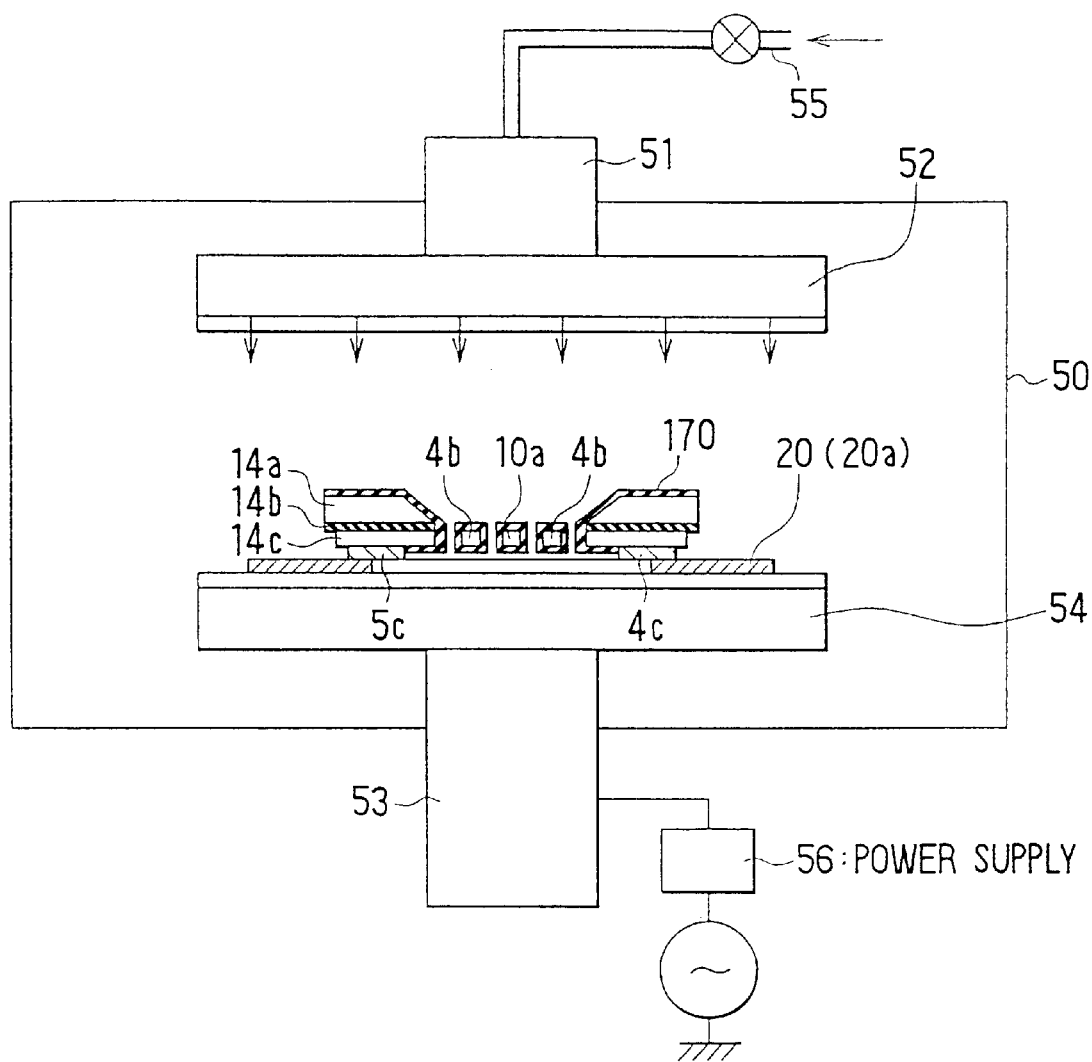
FIG. 21 is a view schematically showing a configuration of an RIE apparatus in the tenth embodiment.
Figure 22:
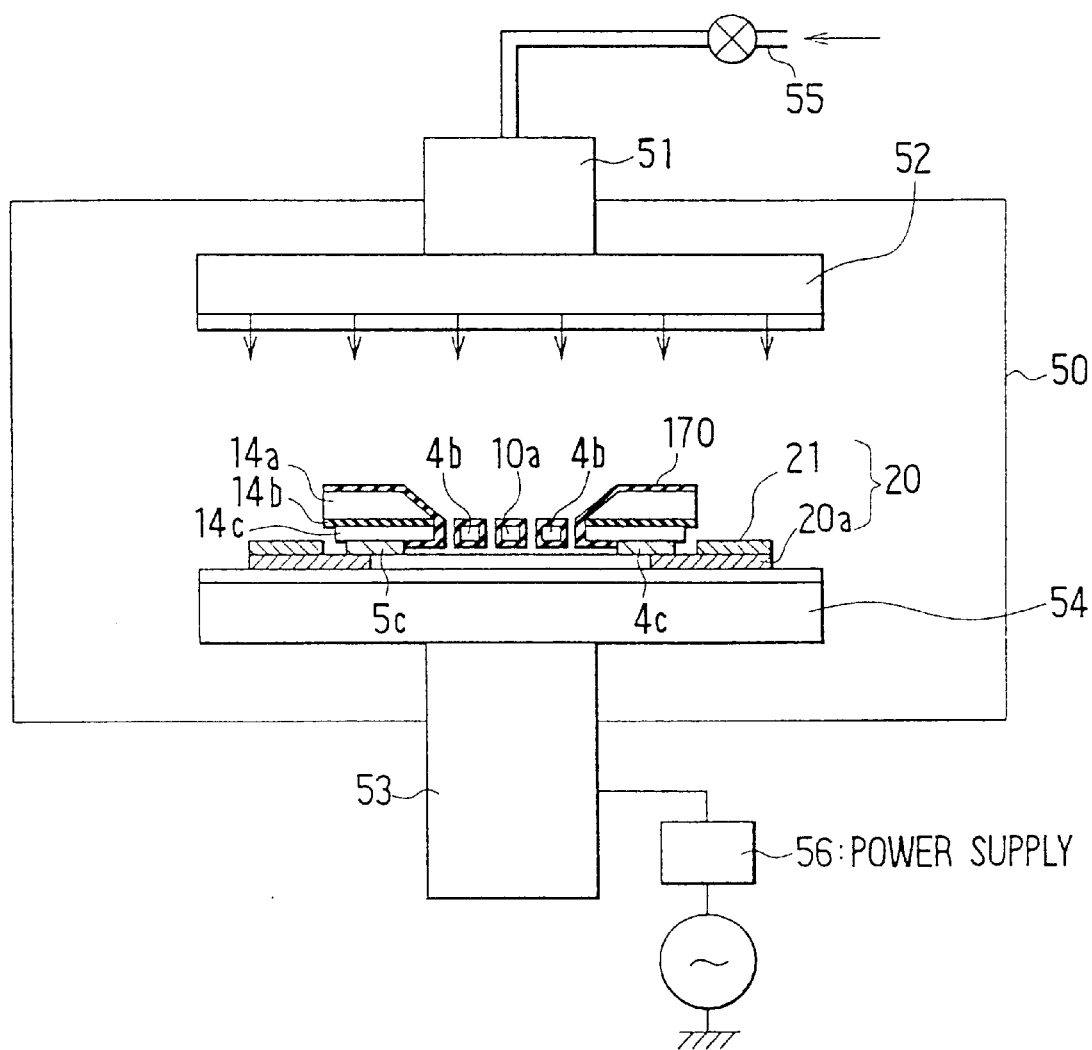
FIG. 22 is a view schematically showing an intermediate member in the RIE apparatus as another example.

In the present embodiment, after a second etching step shown in FIG. 20G is carried out, an electrode forming etching step (third etching step) as shown in FIG. 20H is carried out using reactive ion etching (RIE) in plasma. At this electrode forming etching step, for example, a parallel plate type dry etching apparatus as shown in FIG. 21 or 22. This etching apparatus includes an upper electrode 52 provided in an upper part of a chamber 50 and supported by a support portion 51 and a lower electrode 54 provided in a lower part of the chamber 50 and supported on a base 53 in a face-to-face relationship with each other. Gas can be introduced from a reactive gas inlet port 55 to the upper electrode 52 in the chamber 50, and an object to be etched can be placed on the lower electrode 54. An RF field is applied between the upper electrode 52 and lower electrode 54 by a power supply 56 to generate plasma between the electrodes 52 and 54, thereby applying ionized gas to the object to be etched.

Here, the object to be etched is an SOI substrate 14 (shown in FIG. 20G) which has been subjected to the steps up to the second etching step and whose silicon oxide film 14c is exposed on the rear surface thereof. The object to be etched is disposed such that the surface thereof opposite to the side on which the silicon oxide film 14c is exposed is in a face-to-face relationship with the lower electrode 54 (i.e., in a state which is the reverse of the state shown in FIG. 20G).

A ring-shaped sheet material 20*a* made of a conductive substance is interposed as an intermediate member 20 between the object to be etched and the lower electrode 54 facing each other to prevent them from contacting each other. The intermediate member 20 is not required to always have a ring-like configuration. The material for the same is required only to be conductive and, for example, a silicon substrate or the like may be used. An intermediate member 20 made of an insulating material is not preferable because it can cause the movable electrodes and fixed electrodes to electrostatically stick to each other because of the potential difference between them that occurs during dry etching. That is, the conductive intermediate member 20 prevents the potential difference between the movable electrodes and the fixed electrodes from generating, thereby preventing the sticking of the movable electrodes to the fixed electrodes.

Further, in order to improve in-plane uniformity of the etching rate of the silicon oxide film 14*c* during dry etching, the intermediate member 20 preferably has a two-layer structure as shown in FIG. 22 in which a sheet 21 constituted by a silicon oxide film (quartz plate) is attached to the periphery of the sheet material 20*a* where the object to be etched is not placed. Since the material of the sheet 21 is the same as that of he silicon oxide film 14 that is to be etched, the uniformity of the etching rate of the silicon oxide film 14 is improved on the entire surface thereof.

In such a configuration of the apparatus, dry etching at the electrode forming etching step proceeds from the rear side of the silicon oxide film 14*c* (the surface thereof toward the single crystal silicon wafer 14*a*) to remove the silicon oxide film 14*c*. As a result of the execution of such an electrode forming etching step, the opening 2*a* contiguous with the trenches 16 is formed, and the mass portion 7, beam portions 8*a* and 8*b* and movable electrodes 10*a* and 10*b* of the beam structure 3 are released. At this time, the fixed electrodes 4*b* and 5*b* of the fixed electrode structures 4 and 5 are also released to be cantilevered on the fixed electrode wiring portions 4*a* and 5*a*. Thus, as a result of the execution of the electrode forming etching step, the beam structure 3 and fixed electrode structures 4 and 5 are formed.

The etching conditions for the dry etching at this step are controlled to form the hydrophobic thin film 170 on the surface of at least the movable electrodes 10*a* and 10*b* and the fixed electrodes 4*b* and 5*b* using the gas for the etching as a material (thin film forming step). That is, the thin film forming step is carried out simultaneously with the electrode forming etching step in the present embodiment.

For example, when the dry etching is carried out by introducing gas suitable for dry etching such as $CF_4$, $CHF_3$ or Ar, the etching conditions are controlled to form the hydrophobic thin film 170 on the surface of the etched electrodes from a deposit such as a fluorocarbon film. Referring to the etching conditions, it is preferable to use an etching gas of $SiO_2$ which has a high selection ratio against Si.

The hydrophobic thin film 170 such as the fluorocarbon film can suppress the sticking phenomenon caused by an intermolecular force acting between solid substances because its surface energy can be made small. In addition, since the mass portion 7, beam portions 8*a* and 8*b* and movable electrodes 10*a* and 10*b* are placed on the intermediate member 20 during this electrode forming etching step such that the surfaces thereof do not contact the surface of the lower electrode 54 of the dry etching apparatus, it is possible to prevent foreign substances from sticking to the surface of the sensor, thereby improving the yield of production.

A dicing step follows the execution of such an electrode forming etching step to cut the SOI substrate 14 into sensor chips in a predetermined configuration, thereby completing a basic structure of a semiconductor acceleration sensor 1.

According to the manufacturing method described above, it is possible to release the movable electrodes 10*a* and 10*b*, beam portions 8*a* and 8*n* and fixed electrodes 4*b* and 5*b* to allow movement of the same, and to form the hydrophobic thin film 170 (e.g., a fluorocarbon film) that reduces the intermolecular force acting on the sides thereof at the same step. Since sticking can be thus suppressed further, it is possible to improve the yield of production further and to suppress sticking attributable to an electrostatic force or the like during driving (during the use of the sensor). The other effects are the same as those of the first embodiment.

Eleventh Embodiment

FIGS. 23A through 23H are schematic sectional views showing an example of manufacturing steps according to an eleventh preferred embodiment of the invention which will be described only in points which are different from the tenth embodiment.

In the tenth embodiment, i.e., in the first embodiment as well, in order to form the opening 2*a* in the silicon wafer 14*a*, the first etching step utilizing wet etching (see FIG. 20F) is sequentially followed by the second and third electrode forming etching steps utilizing dry etching (see FIGS. 20G and 20H and FIGS. 21 and 22). However, etching may be alternatively performed in an atmosphere in a vapor phase from the first stage. Referring to the method of etching in this case, a dry etching apparatus is generally used, and anisotropic dry etching is performed to control the dimension of the opening 2*a* accurately.

Figure 23A:
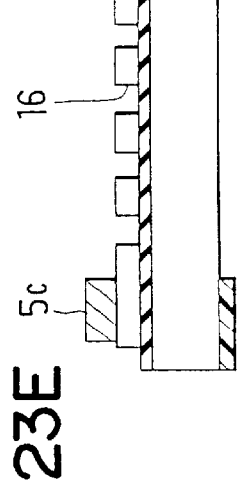
FIGS. 23A to 23H are cross-sectional views showing manufacturing steps of a semiconductor acceleration sensor in an eleventh preferred embodiment.
Figure 23B:
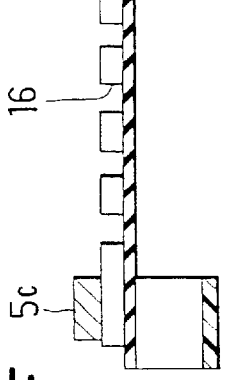
Figure 23C:
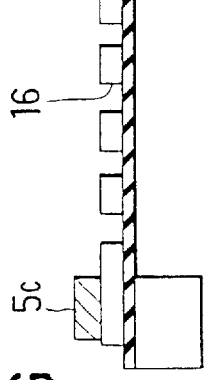
Figure 23D:
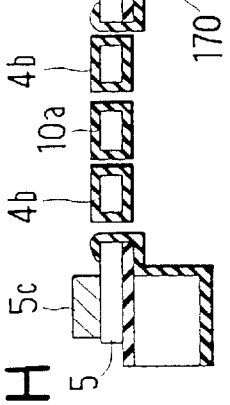
Figure 23E:
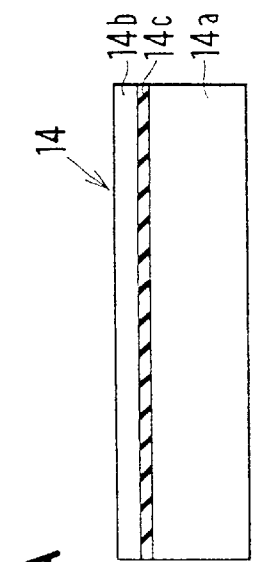

Specifically, in the present embodiment, an SOI substrate 14 similar to that in the first embodiment is provided as shown in FIG. 23A. Then, an electrode pad forming step shown in FIG. 23B, a dimension adjusting step shown in FIG. 23C, a mask forming step shown in FIG. 23D and a trench forming step shown in FIG. 23E are carried out substantially similarly to the first embodiment. In the present embodiment, it should be noted that the mask forming step shown in FIG. 23D provides a resist resistant to dry etching as a mask 150.

Figure 23F:
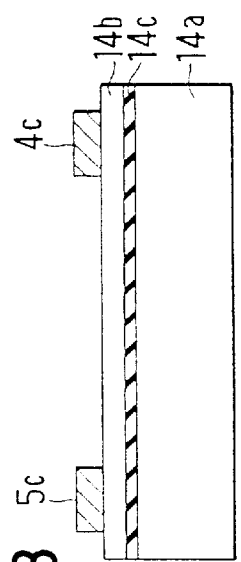
Figure 23G:
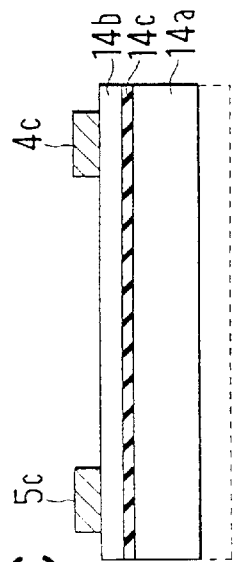
Figure 23H:
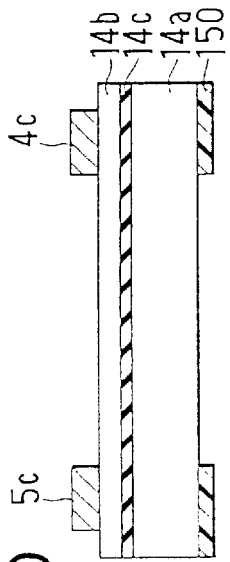

Then, at an etching step shown in FIG. 23F, anisotropic dry etching is performed from the side of the single crystal silicon wafer 14*a* at a side of the mask 150 to remove the wafer 14*a*, thereby exposing the rear surface (lower surface) of the silicon oxide film 14*c*. Next, as shown in FIG. 23G, ashing is performed to remove the mask 150. Further, at an electrode forming etching step shown in FIG. 23H, dry etching is performed from the rear side of the silicon oxide film 14*c* as in the tenth embodiment to form the beam structure 3 and the fixed electrode structures 4 and 5 and to form the hydrophobic thin film 170.

The manufacturing method of the present embodiment can provide the effect of the etching to form electrodes as in the tenth embodiment. In addition, since the present manufacturing method allows the opening 2*a* to be formed only with dry etching, it is possible to simplify the manufacturing steps and to eliminate the possibility of sticking at movable portions such as the movable electrodes 10*a* and 10*b*. When such anisotropic dry etching is employed, since the etching proceeds in a direction substantially perpendicular to the surface of the single crystal silicon wafer 14*a*, there is no need for an increase in the mask dimensions and there is no possibility of an increase in the chip size.

However, since dry etching as in the present embodiment has an etching rate lower than that of wet etching utilizing an aqueous solution of KOH, the thickness of the single crystal silicon wafer 14a is preferably adjusted to about 300 µm in order to improve throughput. The electrode forming etching step in the tenth and eleventh embodiments may be anisotropic dry etching if possible.

While the above-described embodiment allows simplification of manufacturing steps including execution of the thin film forming step and electrode forming etching step with the same apparatus because those steps are carried out simultaneously, the thin film forming step may be performed after the electrode forming etching step. For example, the hydrophobic thin film 170 may be formed by changing the composition and pressure of the introduced gas and the like and establishing conditions that allows deposition, without taking out the work piece from the etching apparatus after the electrode forming etching step. Alternatively, the work piece may be removed from the etching apparatus after the electrode forming etching step to be placed in a plasma polymerizing apparatus, thereby forming the hydrophobic thin film 170 utilizing plasma polymerization.

While the present invention has been shown and described with reference to the foregoing preferred embodiments, it will be apparent to those skilled in the art that changes in form and detail may be made therein without departing from the scope of the invention as defined in the appended claims.

For example, the first and third embodiments have a configuration wherein the first etching step is followed by the second etching step to remove the residual single crystal silicon wafer 14a having a thickness of about 10 µm utilizing dry etching and then the third etching step is carried out to remove the silicon oxide film 14c utilizing dry etching with the etching rate changed. Alternatively, by controlling the conditions for the dry etching to set a small difference between the etching rates of the single crystal silicon wafer 14a and silicon oxide film 14c, the second and third etching steps can be carried out continuously without changing the etching conditions for the dry etching apparatus. It is therefore possible to simplify the manufacturing steps.

Obviously, it is possible also in the second embodiment to simplify the manufacturing steps by setting a small difference between the etching rate of the high concentration impurity layer 14d at the second etching step and the etching rate of the silicon oxide film 14c at the third etching step to allow the second and third steps to be performed continuously without changing the etching conditions for the dry etching apparatus.

In each of the above embodiments, the dicing step is performed to complete a basic structure of a semiconductor acceleration sensor after forming the opening 2a of the single crystal silicon wafer 14 or 140, i.e., after forming the beam structure 3 and fixed electrode structures 4 and 5 having fine features. Such a dicing step at the final stage of the manufacture involves the risk of the breakage of the fine features of the semiconductor acceleration sensor 1. That is, since the dicing step utilizes a dicing saw rotated at a high speed, the SOI substrate 14 or 140 is continually subjected to vibration, which can result in the breakage of the fine features attributable to such vibration. In order to avoid this, a manufacturing method may be employed in which the dicing step is carried out before the step of forming the openings 2a to divide the substrate into chips on which the openings 2a are formed thereafter.

Specifically referring to the first through third embodiments, the dicing step may be carried out to divide the substrate into chips after the first etching step and, thereafter, the second and third etching steps may be carried out with each of the sensor chips retained on a chip tray or the like. In such a configuration, since the fine features are supported by the residue of the single crystal silicon wafer 14a having a thickness of about 10 µm and the silicon oxide film 14c to improve anti-vibration characteristics during dicing, the breakage of the fine features can be avoided. In this case, since the dry etching at the second and third etching steps is carried out in a vacuum chamber to provide the configuration of the work piece with flexibility, the configuration to perform the second and third etching steps after the dicing step creates no problem associated with the manufacturing steps.

The invention can be applied not only to semiconductor acceleration sensors but also to other semiconductor dynamic quantity sensors such as yaw rate sensors and angular velocity sensors. According to the method for manufacturing a semiconductor dynamic quantity sensor according to the invention, a contact type sensor which detects contact between movable and fixed electrodes can be provided as described with reference to examples of a capacity type sensor.

What is claimed is:

1. A method for manufacturing a semiconductor dynamic quantity sensor, comprising steps of:

preparing a semiconductor substrate including a first semiconductor region and a second semiconductor region isolated from the first semiconductor region by an insulation film interposed therebetween; and forming a movable portion in the first semiconductor region by etching both the first semiconductor region and the second semiconductor region, wherein the movable portion is defined finally at a movable portion defining step that is carried out in a vapor phase atmosphere in the step of forming the movable portion.

2. The method as recited in claim 1, wherein one of the first semiconductor region, the second semiconductor region, and the insulation film is etched at the movable portion defining step to finally define the movable portion.

3. The method as recited in claim 1, wherein the step of forming the movable portion includes steps of:

forming a trench in the first semiconductor region;

etching the second semiconductor region to expose at least a portion of the insulation film corresponding to the trench; and performing the movable portion defining step in the vapor phase atmosphere.

4. The method as recited in claim 3, wherein the step of forming the movable portion includes:

a step of forming a protection film on the first semiconductor region and in the trench after forming the trench;

a step of etching the insulation film after etching the second semiconductor region; and the movable portion defining step for etching the protection film.

5. The method as recited in claim 3, wherein:

the trench is formed in the first semiconductor region to remain part of the first semiconductor region at a bottom thereof; and the part of the first semiconductor region at the bottom of the trench is removed at the movable portion defining step.

6. The method as recited in claim 3, further comprising a step of forming a protection film on the first semiconductor region and in the trench, wherein;

the trench is formed in the first semiconductor region to remain part of the first semiconductor region at the bottom thereof; and the protection film is removed at the movable portion defining step after removing the part of the first semiconductor region.

7. The method as recited in claim 3, wherein:

the step of etching the second semiconductor region includes a first etching step of etching the second semiconductor region to remain part of the second semiconductor region on the insulation film with a specific thickness, and a second etching step of etching the part of the second semiconductor region remaining on the insulation film in a vapor phase atmosphere to expose the insulation film; and the insulation film is removed at the movable portion defining step to form an opening communicating with the trench.

8. The method as recited in claim 7, wherein:

the second semiconductor region has an impurity high concentration layer including impurities therein and contacting the insulation film with a specific depth; and the first etching step is performed using a specific etchant to be substantially stopped when the impurity high concentration layer is exposed, in accordance with an etching rate of the specific etchant to the impurity high concentration layer.

9. The method as recited in claim 7, wherein:

the first etching step is performed using a specific etchant in a state where a voltage is applied to the first semiconductor region to form a depletion layer in a portion of the second semiconductor region contacting the insulation film; and the first etching step is substantially stopped when the depletion layer is exposed.

10. The method as recited in claim 7, wherein the second etching step of etching the part of the second semiconductor region and the movable portion defining step are successively performed at an equal etching condition with each other.

11. The method as recited in claim 7, wherein the first etching step is an anisotropic etching step.

12. The method as recited in claim 3, wherein:

the step of etching the second semiconductor region is carried out in a vapor phase atmosphere; and the insulation film is removed at the movable portion defining step.

13. The method as recited in claim 12, wherein the step of etching the second semiconductor region is an anisotropic dry etching step.

14. The method as recited in claim 12, wherein the step of etching the second semiconductor region and the movable portion defining step are successively carried out at an equal etching condition with each other.

15. The method as recited in claim 3, wherein the step of forming the trench includes steps of:

forming a mask on the first semiconductor region;

performing an etching to the first semiconductor region to form a first trench portion and a second trench portion through the mask, the first trench portion having a width larger than that of the second trench portion; and stopping the etching when the insulation film is exposed from the first trench portion and the first semiconductor region remains at a bottom of the second trench portion, and wherein the first semiconductor region remaining at the bottom of the second trench portion is removed at the movable portion defining step in the vapor phase atmosphere after removing the insulation film.

16. The method as recited in claim 15, wherein the first trench portion and the second trench portion are formed by an anisotropic dry etching.

17. The method as recited in claim 3, further comprising a step of covering the first semiconductor region with a protection film after forming the trench, the protection film being made of a material separatable from the first semiconductor region.

18. The method as recited in claim 3, further comprising a step of adjusting a shape of the movable portion after the movable portion is finally defined by the movable portion defining step.

19. The method as recited in claim 18, wherein:

the trench is formed by a dry etching; and the step of adjusting the shape of the movable portion is an auxiliary dry etching step that is carried out to the movable portion from a second semiconductor region side.

20. The method as recited in claim 19, wherein the auxiliary dry etching step is an isotropic dry etching step.

21. The method as recited in claim 1, wherein the semiconductor substrate is cut into a sensor chip by a dicing step before performing the movable portion defining step.

22. The method as recited in claim 1, wherein the step of forming the movable portion in the first semiconductor region includes a step of polishing the second semiconductor region to have a specific thickness.

23. The method as recited in claim 1, further comprising a step of forming a hydrophobic thin film on the movable portion after the movable portion defining step.

24. The method as recited in claim 23, wherein the step of forming the hydrophobic thin film is carried out simultaneously with the movable portion defining step in the vapor phase atmosphere.

25. The method as recited in claim 23, wherein the step of forming the hydrophobic thin film is carried out by a reactive ion etching (RIE) in plasma.

26. The method as recited in claim 23, wherein a contact angle of the hydrophobic thin film with water is equal to or larger than 70 degrees.

27. The method as recited in claim 23, wherein the hydrophobic thin film is made of an organic material.

28. The method as recited in claim 23, wherein the hydrophobic thin film is a fluorine type thin film including fluorine.

29. The method as recited in claim 23, wherein the movable portion defining step and the step of forming the hydrophobic thin film are successively carried out in a chamber under first and second etching conditions, respectively.

30. The method as recited in claim 1, wherein the movable portion defining step is a reactive ion etching step carried out in plasma between a first electrode and a second electrode facing each other for etching the insulation film, the reactive ion etching step being carried out in a state where;

the semiconductor substrate is disposed on the first electrode with the insulation film having an exposed surface facing the second electrode and with an intermediate member interposed between the semiconductor substrate and the first electrode, the intermediate member preventing a surface of the semiconductor substrate corresponding to the exposed surface of the insulation film on an opposite side of the insulation film from contacting the first electrode.

31. The method as recited in claim 30, wherein the intermediate member is conductive.

32. The method as recited in claim 30, wherein the intermediate member includes a conductive layer and a silicon oxide layer.

33. The method as recited in claim 32, wherein the conductive layer is made of silicon.

34. A semiconductor dynamic quantity sensor comprising:
- a semiconductor support substrate having a specific resistance equal to or less than 3 Ω·cm;
- an insulation film provided on the support substrate;
- a semiconductor layer provided on the support substrate with the insulation film interposed therebetween and having a specific resistance equal to or less than 3 Ω·cm;
- a movable electrode provided in the semiconductor layer to be displaced according to a dynamic quantity acting thereto; and
- a fixed electrode fixedly provided in the semiconductor layer to make a specific gap with the movable electrode and to form a capacitor with the movable electrode, the capacitor having a capacity that changes in response to displacement of the movable electrode to detect the dynamic quantity.

35. The semiconductor dynamic quantity sensor as recited in claim 34, wherein the fixed electrode includes a first fixed electrode portion forming a first capacitor with the movable electrode and a second fixed electrode portion forming a second capacitor with the movable electrode, the first capacitor and the second capacitor having first and second capacities that change on a differential basis according to the displacement of the movable electrode.

36. The semiconductor dynamic quantity sensor as recited in claim 35, wherein the dynamic quantity is detected based on a change in a voltage of the movable electrode while applying first and second carrier wave signals to the first fixed electrode portion and the second fixed electrode portion, the first and second carrier wave signals being different from each other at 180° in phase.

* * * * *